United States Patent
Xie et al.

(10) Patent No.: US 12,506,080 B2
(45) Date of Patent: Dec. 23, 2025

(54) REDUCED CAPACITANCE BETWEEN POWER VIA BAR AND GATES

(71) Applicant: International Business Machines Corporation, Armonk, NY (US)

(72) Inventors: Ruilong Xie, Niskayuna, NY (US); Kisik Choi, Watervliet, NY (US); Reinaldo Vega, Mahopac, NY (US); Albert M. Chu, Nashua, NH (US); Nicholas Anthony Lanzillo, Wynantskill, NY (US); Lawrence A. Clevenger, Saratoga Springs, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 469 days.

(21) Appl. No.: 18/061,602

(22) Filed: Dec. 5, 2022

(65) Prior Publication Data
US 2024/0186245 A1   Jun. 6, 2024

(51) Int. Cl.
| | | |
|---|---|---|
| *H01L 23/528* | (2006.01) | |
| *H10D 30/67* | (2025.01) | |
| *H10D 62/10* | (2025.01) | |
| *H10D 84/01* | (2025.01) | |
| *H10D 84/83* | (2025.01) | |

(52) U.S. Cl.
CPC ..... *H01L 23/5286* (2013.01); *H10D 30/6729* (2025.01); *H10D 62/121* (2025.01); *H10D 84/0149* (2025.01); *H10D 84/83* (2025.01)

(58) Field of Classification Search
CPC ............... H10D 84/83; H10D 84/0149; H10D 30/6729; H10D 62/121; H10D 30/6735; H10D 84/038; H01L 23/5286
See application file for complete search history.

(56) References Cited

U.S. PATENT DOCUMENTS

| | | |
|---|---|---|
| 9,570,395 B1 | 2/2017 | Sengupta et al. |
| 10,586,765 B2 | 3/2020 | Smith et al. |
| 10,636,739 B2 | 4/2020 | Beyne et al. |
| 10,700,207 B2 | 6/2020 | Chen et al. |

(Continued)

FOREIGN PATENT DOCUMENTS

| | | |
|---|---|---|
| CN | 114512453 A | 5/2022 |
| TW | 202221878 A | 6/2022 |

(Continued)

OTHER PUBLICATIONS

Office Action received for Taiwan Patent Application Serial No. 112119605, dated Mar. 13, 2024, 6 pages(Original Copy Only).

(Continued)

*Primary Examiner* — Changhyun Yi
(74) *Attorney, Agent, or Firm* — Amin, Turocy & Watson, LLP

(57) ABSTRACT

One or more systems, devices, and/or methods of fabrication provided herein relate to reduced parasitic capacitance of power via bars. According to one embodiment, a semiconductor device can comprise a field-effect transistor (FET), and a power via bar coupled to a backside power rail, wherein the power via bar has greater height adjacent to a source and drain region of the field-effect transistor (FET) relative to a gate of the FET to mitigates parasitic capacitance within the device.

24 Claims, 33 Drawing Sheets

(56) References Cited

U.S. PATENT DOCUMENTS

| | | | |
|---|---|---|---|
| 10,861,790 B2 | 12/2020 | Chen et al. | |
| 10,872,818 B2 | 12/2020 | Chiang et al. | |
| 2020/0105671 A1 | 4/2020 | Lai et al. | |
| 2021/0111115 A1 | 4/2021 | Morrow et al. | |
| 2021/0118793 A1 | 4/2021 | Shen et al. | |
| 2021/0183772 A1 | 6/2021 | Lin et al. | |
| 2021/0272893 A1 | 9/2021 | Song et al. | |
| 2021/0359091 A1* | 11/2021 | Hsu | H10D 30/6757 |
| 2021/0375637 A1 | 12/2021 | Parikh | |
| 2022/0102274 A1 | 3/2022 | Chien et al. | |
| 2024/0170483 A1* | 5/2024 | Jo | H10D 84/0188 |

FOREIGN PATENT DOCUMENTS

| | | |
|---|---|---|
| TW | 202238918 A | 10/2022 |
| TW | I851236 B | 6/2024 |

OTHER PUBLICATIONS

Mathur, R. et al. | "Buried Bitline for sub-5nm SRAM Design." 2020 IEEE International Electron Devices Meeting (IEDM), 2020, p. 20.2.1-20.2.4, doi: 10.1109/IEDM13553.2020.9372042, 4 pages.

Prasad, D. et al. | "Buried Power Rails and Back-side Power Grids: Arm® CPU Power Delivery Network Design Beyond 5nm." 2019 IEEE International Electron Devices Meeting (IEDM), 2019, pp. 19.1.1-19.1.4, doi: 10.1109/EDM19573.2019.8993617, 4 pages.

* cited by examiner

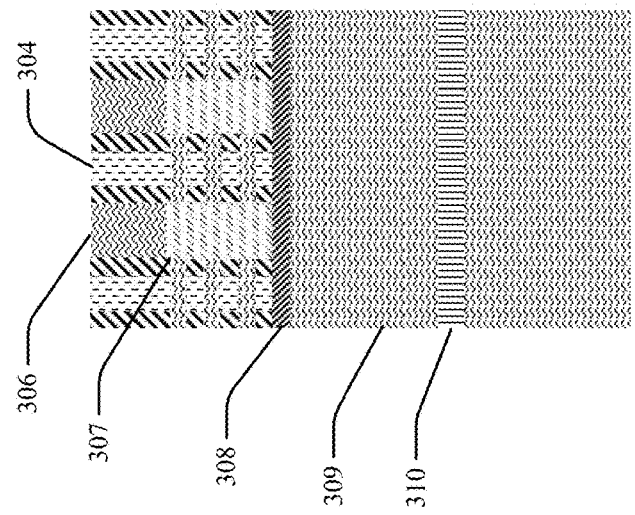
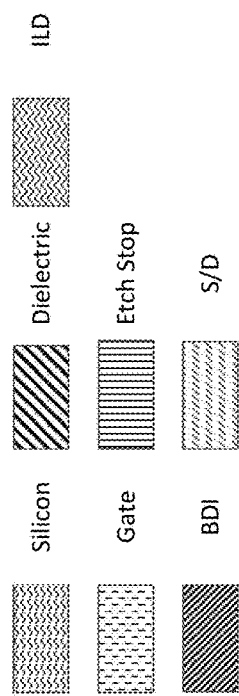
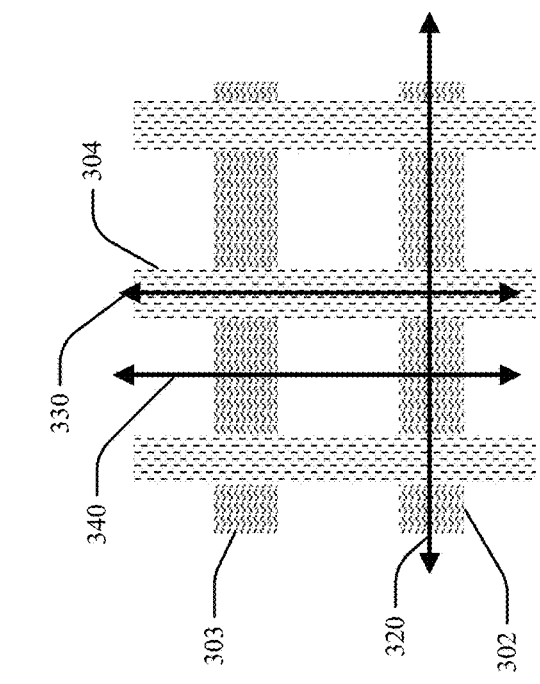
FIG. 3A
FIG. 3B

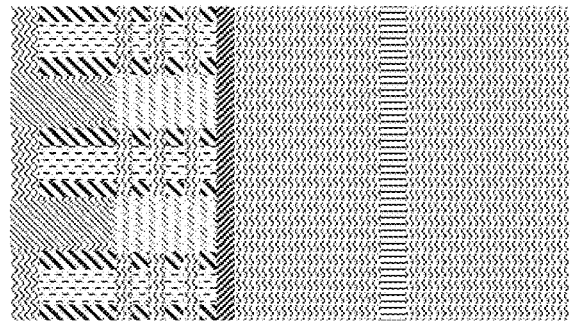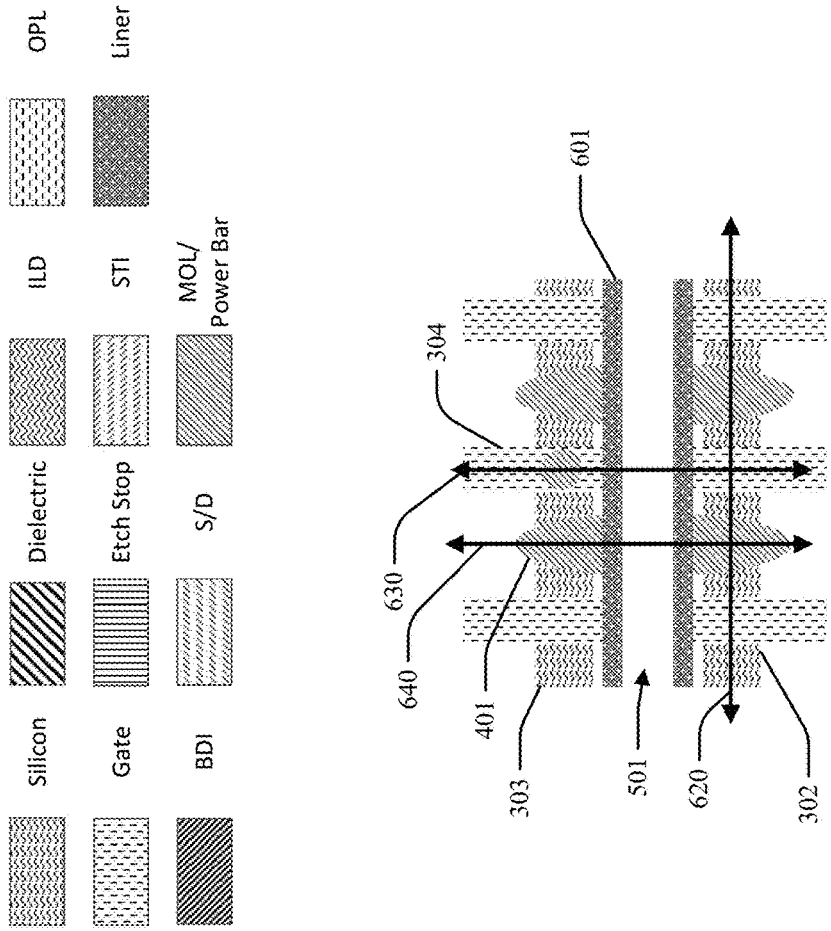
FIG. 6A
FIG. 6B

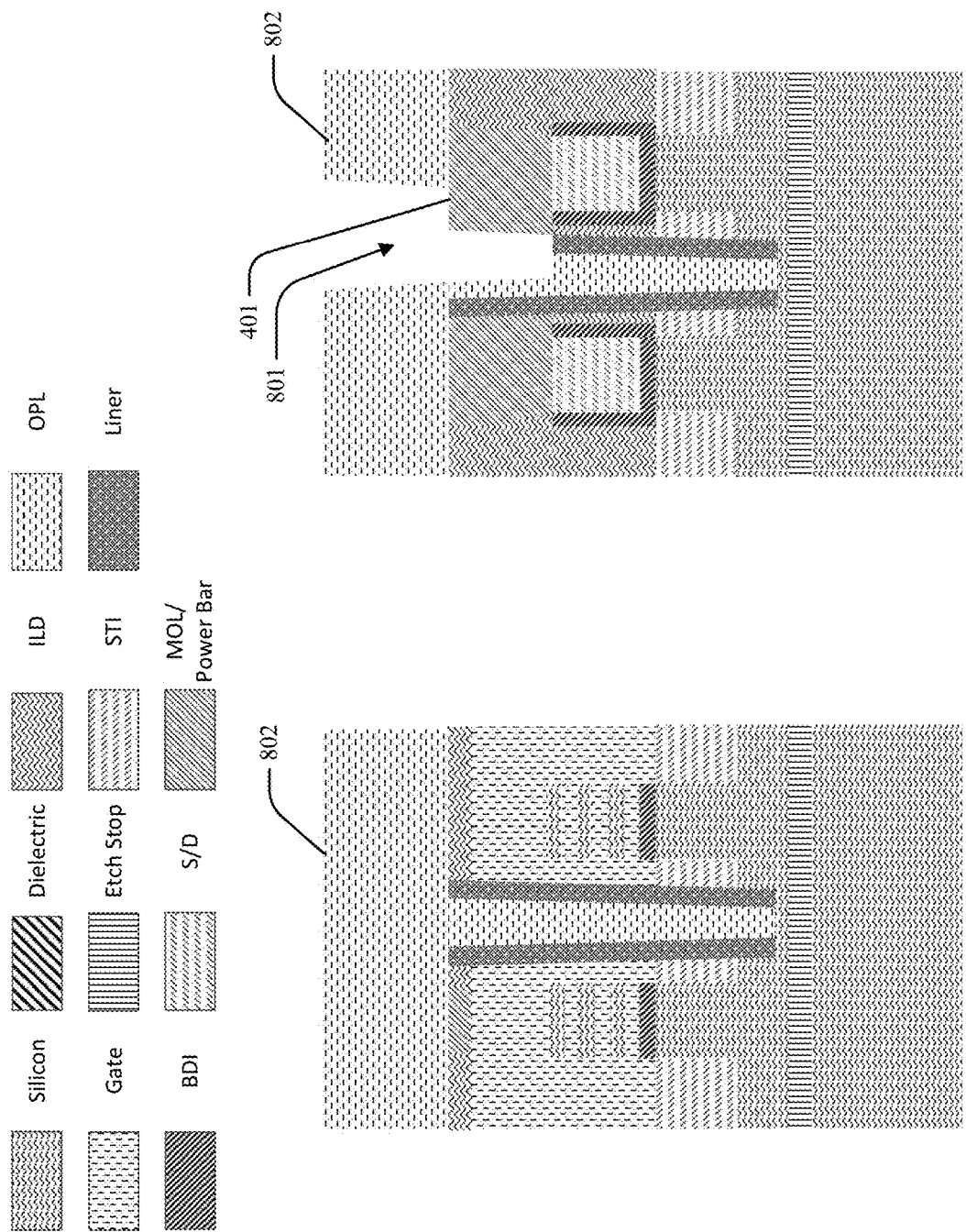

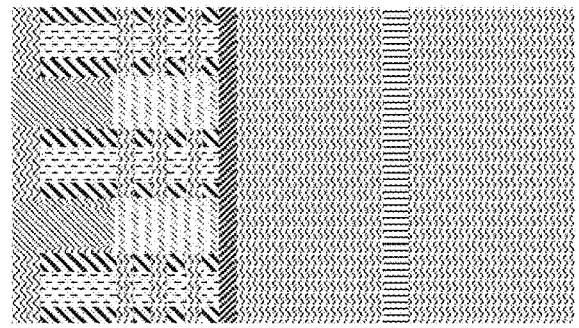
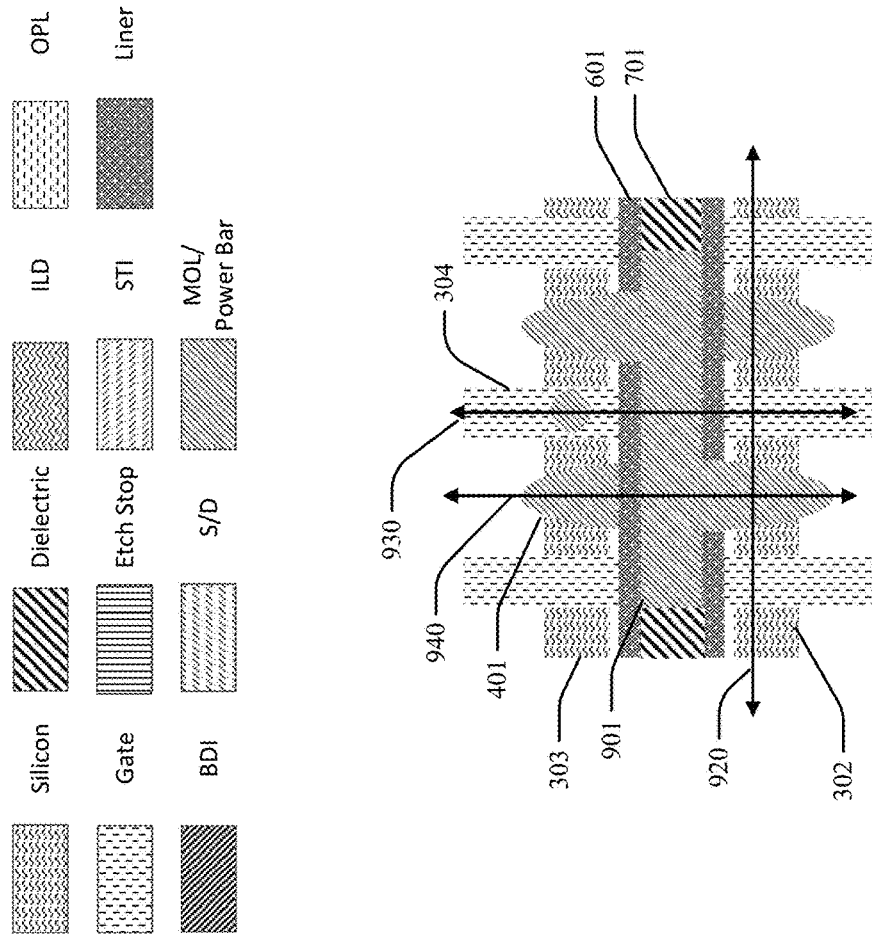
FIG. 9B
FIG. 9A

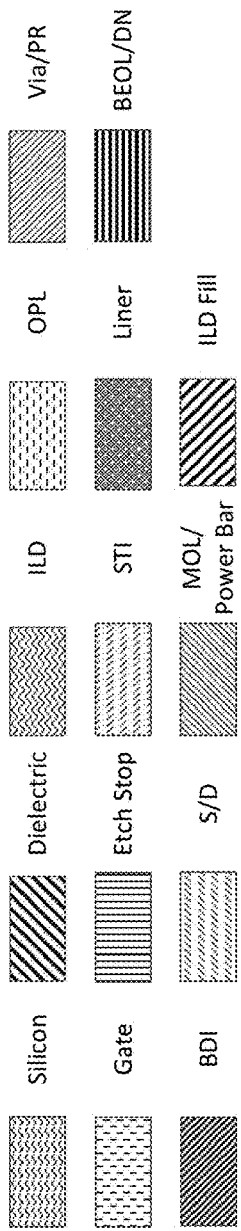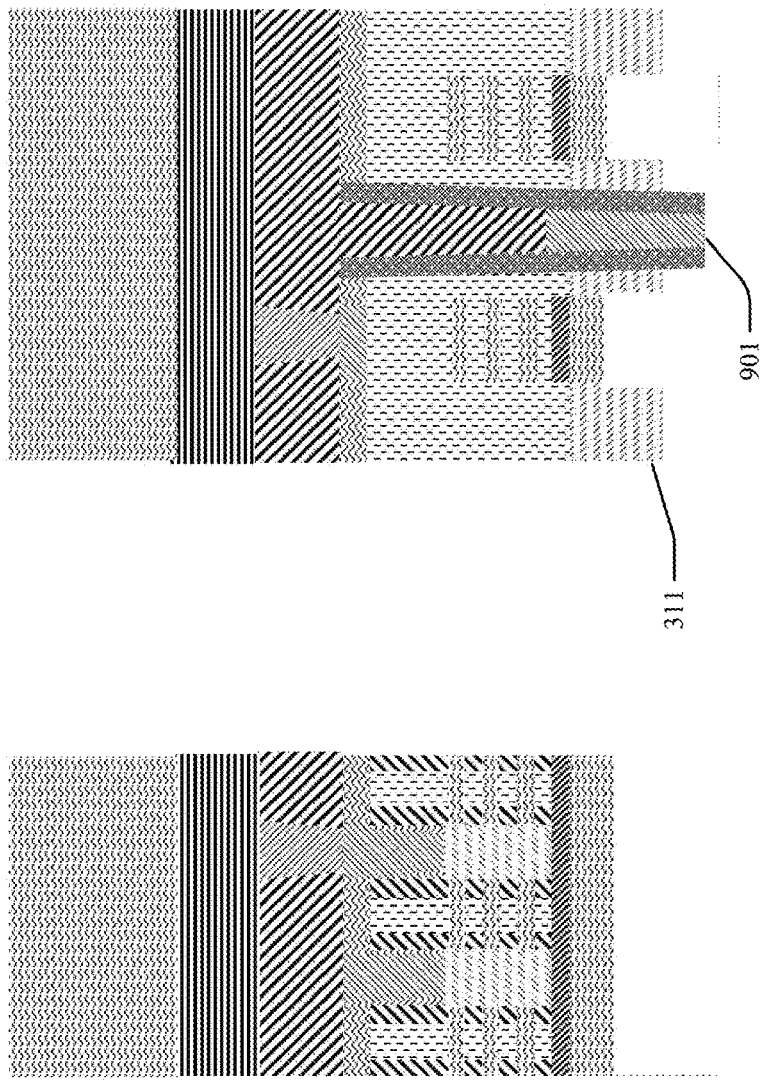
FIG. 14B
FIG. 14A

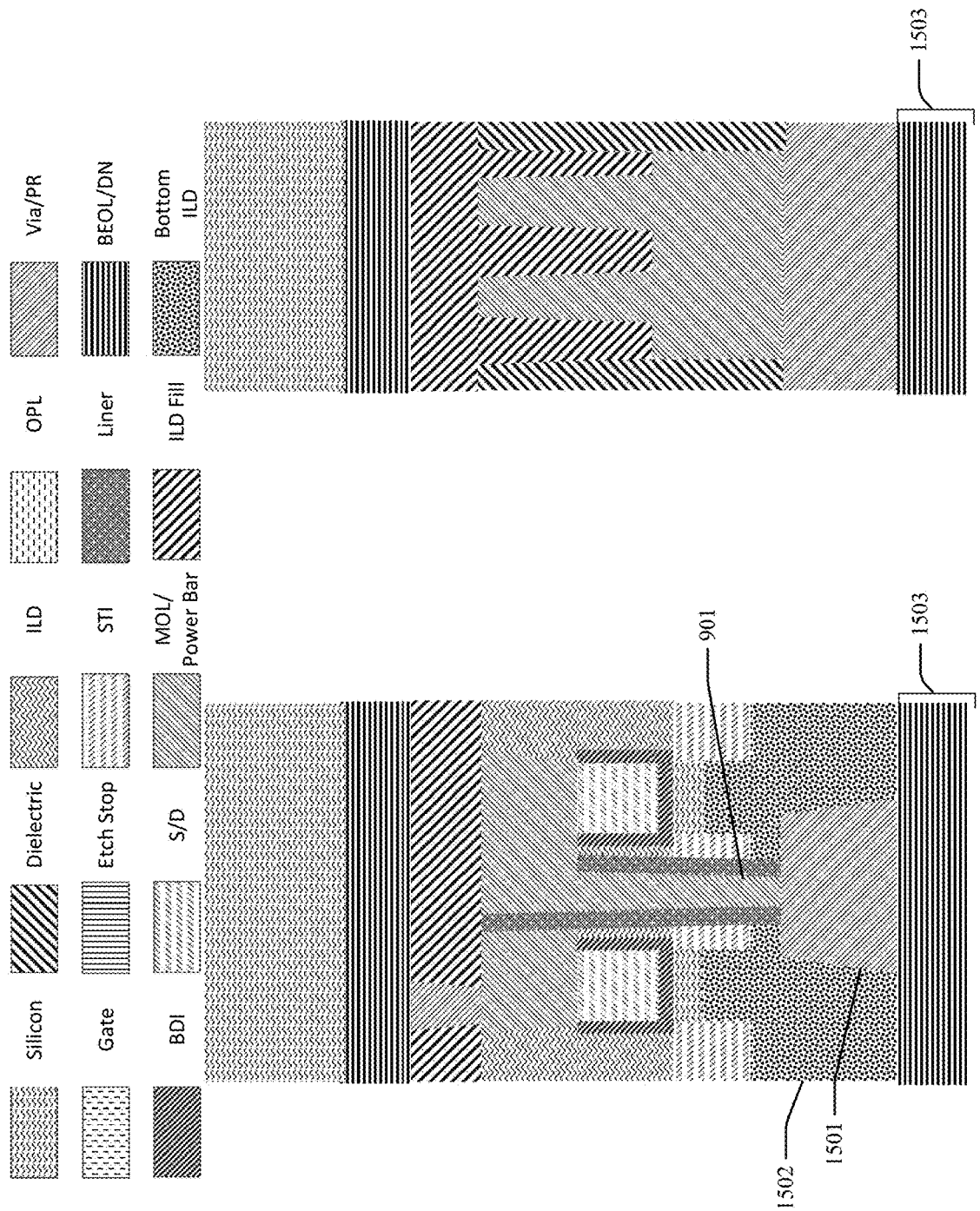

REDUCED CAPACITANCE BETWEEN POWER VIA BAR AND GATES

BACKGROUND

The subject disclosure relates to power via bars, and more specifically, power via bars with reduced parasitic capacitance with gates.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later.

According to an embodiment, a semiconductor device can comprise a field-effect transistor, and a power via bar coupled to a backside power rail, wherein the power via bar has greater height adjacent to a source and drain region of the FET relative to a gate of the FET, to mitigate parasitic capacitance within the device. An advantage of such a device is that due to the lower height of power via bar adjacent to gate ends of the FET, capacitance between gate ends across the power via bar are decreased, thereby improving device performance.

According to another embodiment, a method for fabricating a semiconductor device, by a fabrication system, can comprise forming, by the fabrication system, a first row of adjacent FETs, forming, by the fabrication system, a second row of adjacent FETs, patterning, by the fabrication system, a power via bar between the first row of adjacent FETs and the second row of adjacent FETs, wherein the power via bar is connected to one or more source and drain regions, and recessing, by the fabrication system, the power via bar between gate ends of the first row of adjacent FETs and the second row of adjacent FETs. An advantage of such a method is that by recessing the height of the power via bar between the gate ends, parasitic capacitance across between the gates across the power via bar is reduced, thereby improving device performance.

According to another embodiment, a method of fabricating a semiconductor device, by a fabrication system, can comprise forming, by the fabrication system, middle of line (MOL) contacts between a first row of adjacent FETs and a second row of adjacent FETs, forming, by the fabrication system, middle of line (MOL) contact cuts and gate cuts, forming, by the fabrication system, a first dielectric liner inside the gate cuts, forming, by the fabrication system, one or more dielectric liner cuts, forming, by the fabrication system, a power via bar within the one or more gate cuts, and recessing, by the fabrication system, a first height of the power via bar, wherein the first height is adjacent to gate ends of the first row of adjacent FETs and the second row of adjacent FETs.

According to another embodiment, a semiconductor device can comprise a source and drain region, a gate structure, and a power via bar, wherein the power via bar comprises a first height adjacent to the gate structure and second height adjacent to the source and drain region. An advantage of such a device is that by varying the height of the power via bar at different points within the device, parasitic capacitance can be reduced, thereby improving device performance.

According to another embodiment, a method of fabricating a semiconductor device, by a fabrication system, can comprise forming, by the fabrication system, a source and drain region, forming, by the fabrication system, a gate structure, and forming, by the fabrication system, a power via bar, wherein the power via bar has a first height adjacent to the gate structure and a second height adjacent to the source and drain region. An advantage of such a method is that by varying the height of the power via bar at different points within the device, parasitic capacitance can be reduced, thereby improving device performance.

DESCRIPTION OF THE DRAWINGS

FIG. 3A illustrates a top-down view of an example, non-limiting, starting substrate for production of a semiconductor device in accordance with one or more embodiments described herein.

FIGS. 3B, 3C and 3D illustrate various cross-sections of a starting substrate in accordance with one or more embodiments described herein.

FIG. 6A illustrates a top-down view of an example, non-limiting, fourth stage of production of a semiconductor device in accordance with one or more embodiments described herein.

FIGS. 6B, 6C and 6D illustrate various cross-sections of a fourth stage of production of a semiconductor device in accordance with one or more embodiments described herein.

FIG. 8A illustrates a top-down view of an example, non-limiting, sixth stage of production of a semiconductor device in accordance with one or more embodiments described herein.

FIGS. 8B, 8C and 8D illustrate various cross-sections of a sixth stage of production of a semiconductor device in accordance with one or more embodiments described herein.

FIG. 9A illustrates a top-down view of an example, non-limiting, seventh stage of production of a semiconductor device in accordance with one or more embodiments described herein.

FIGS. 9B, 9C and 9D illustrate various cross-sections of a seventh stage of production of a semiconductor device in accordance with one or more embodiments described herein.

FIGS. 14A, 14B, 14C and 14D illustrate various cross-sections of a twelfth stage of production of a semiconductor device in accordance with one or more embodiments described herein.

FIGS. 15A, 14B, 14C and 14D illustrate various cross-sections of a twelfth stage of production of a semiconductor device in accordance with one or more embodiments described herein.

DETAILED DESCRIPTION

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

Within semiconductor devices, power via bars are an attractive option for designers, as they facilitate powering components through backside powered rails (e.g., power rails located on the bottom of semiconductors). However, standard power via bar typically fill the channel between gate ends of transistors. This placement of power via bars generates parasitic capacitance, as the power via bar functions as a capacitor between gate ends, thereby decreasing device performance.

In view of the aforementioned problems with current power via bar designs, the described subject matter illustrates semiconductor devices and methods of fabrication capable of decreasing and/or eliminating parasitic capacitance of power via bars across gates, thereby increasing device performance. For example, as described in greater detail below, a semiconductor device can comprise a power via bar, wherein the power via bar comprises a first height adjacent to gate ends and a second height adjacent to source and drain regions, wherein the second height is greater than the first height. By recessing the power via bar to the first height between the gate ends, parasitic capacitance across the gates is reduced thereby improving performance. Additionally, by not recessing the power via bar adjacent to the source and drain regions, the power via bar can still supply power through the backside power delivery network.

One or more embodiments are now described with reference to the drawings, where like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Figures 1A, 1B:
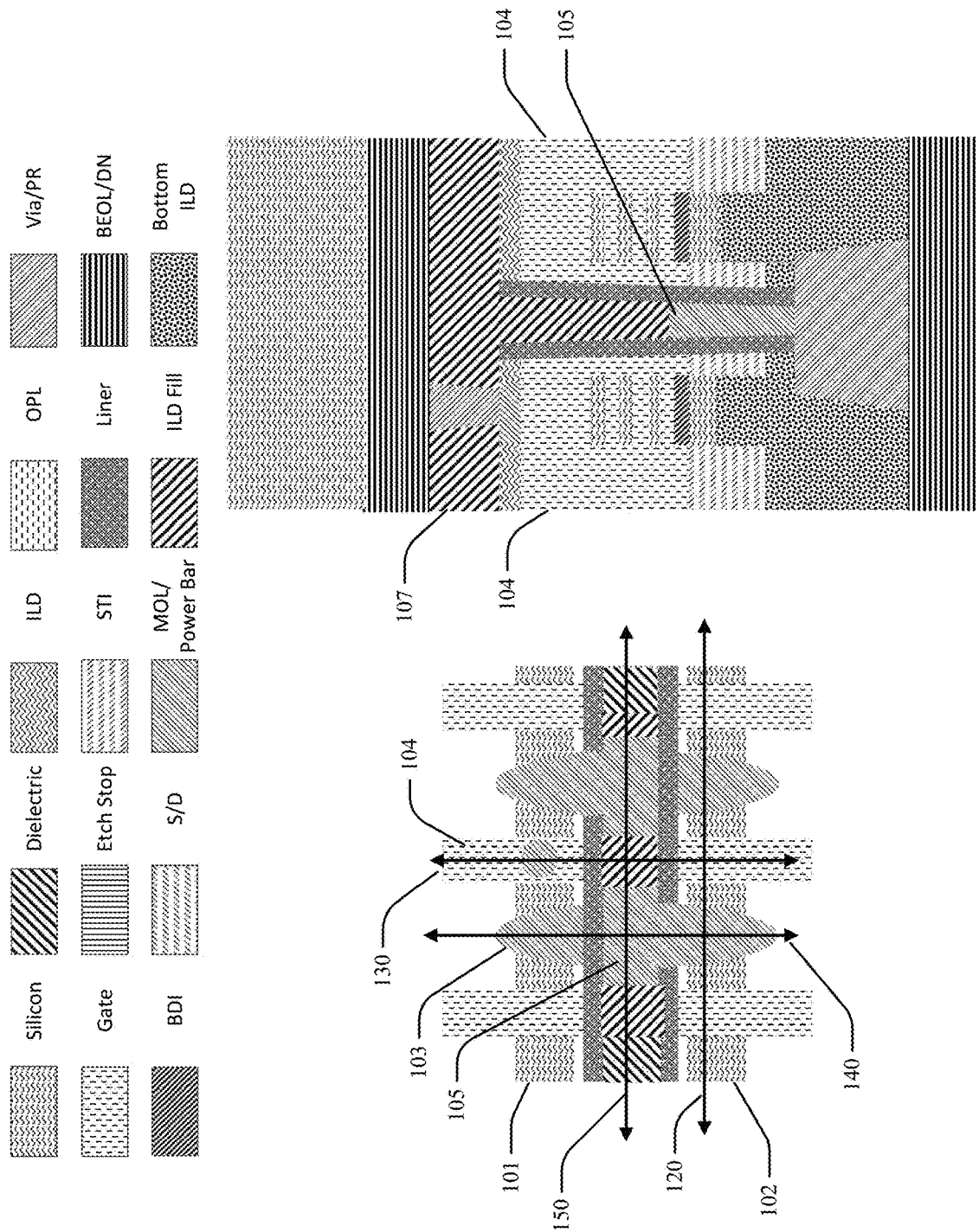
FIG. 1A illustrates a top-down view of an example, non-limiting, semiconductor device in accordance with one or more embodiments described herein.
FIGS. 1B, 1C and 1D illustrate various cross-sections of an example, non-limiting, semiconductor device in accordance with one or more embodiments described herein.

FIG. 1A illustrates a top-down view of an example, non-limiting, semiconductor device in accordance with one or more embodiments described herein.

As shown, FIG. 1A comprises a first row of FETs 101, a second row of FETs 102, a gate structure 104, middle of line (MOL) contacts 103 and power via bar 105. FIG. 1A further comprises lines 120, 130, 140 and 150 utilized to illustrate cross-sections below. In some embodiments, the first row of FETs 101 and the second row of FETs 102 can comprise p-channel FETs (PFETs) or n-channel FETs (NFETs).

Figures 1C, 1D:
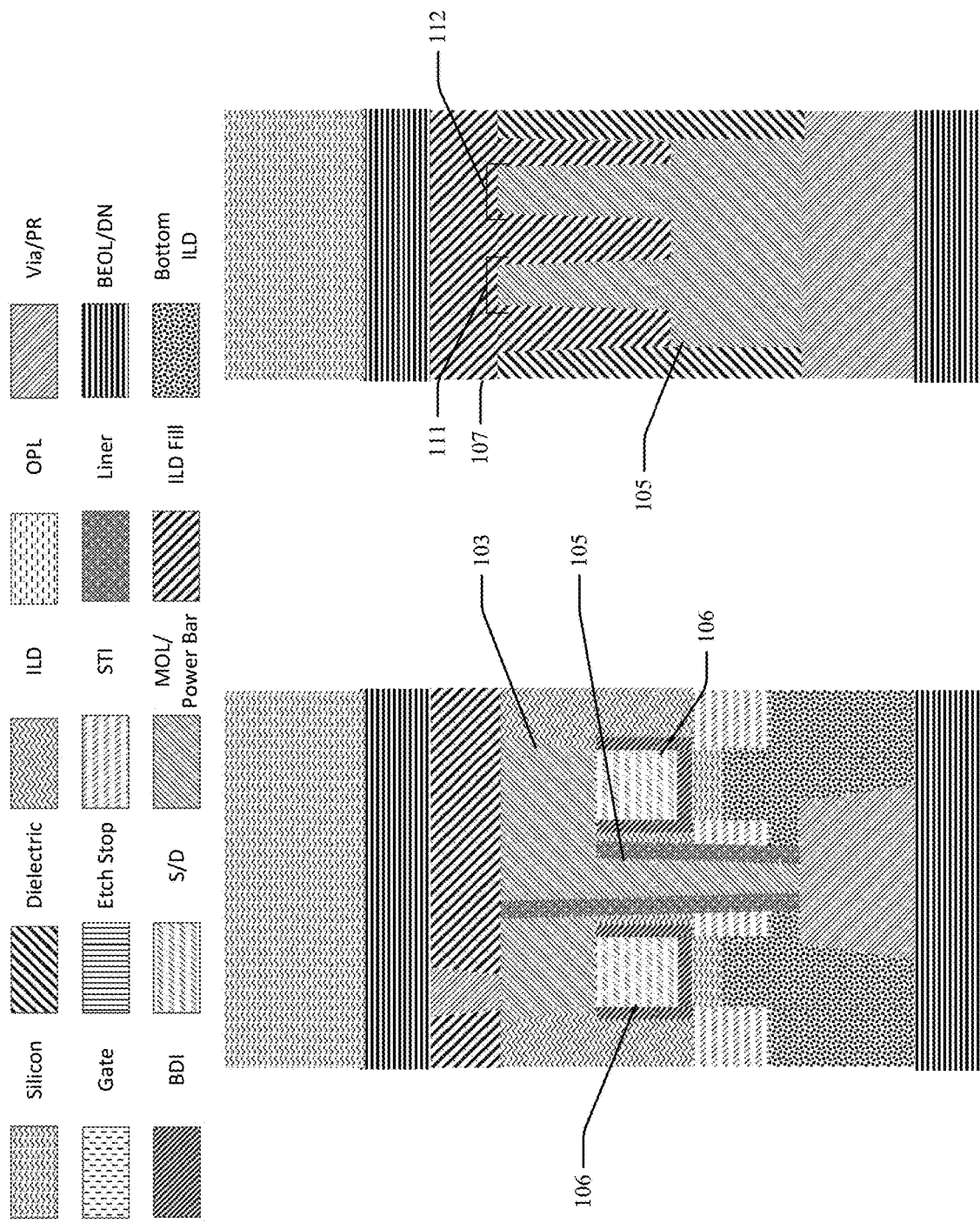

FIGS. 1B, 1C and 1D illustrate various cross-sections of an example, non-limiting, semiconductor device in accordance with one or more embodiments described herein.

FIG. 1B illustrates a cross-section along line 130 of FIG. 1A. As shown, FIG. 1B illustrates power via bar 105 between the ends of gate structure 104. As shown, power via bar 105 has been recessed below the height of the gate structure 104. Accordingly, the power via bar 105 offers reduced parasitic capacitance when compared to existing designs in which the power via bar has the same height as a gate structure. Furthermore, an intermediate layer of dielectric fill (ILD) 107 is deposited on top of power via bar 105 to further reduce parasitic capacitance.

FIG. 1C illustrates a cross-section along line 140 of FIG. 1A. As shown, FIG. 1C illustrates power via bar 105 connected to MOL contact 103, and source/drain regions 106. As shown, the power via bar 105 has not been recessed in the region illustrated by FIG. 1C. Accordingly, the power via bar 105 comprises a first height adjacent to gate ends, such as gate structure 104, and a second height adjacent to source and drain regions, such as source/drain 106.

FIG. 1D illustrates a cross-section along line 150 of FIG. 1A. As shown, the power via bar 105 is covered by ILD 107. Furthermore, the power via bar 105 comprises a first fin 111 and a second fin 112 where the power via bar has not been recessed. Accordingly, the first fin 111 and the second fin 112 are the portions of the power via bar 105 that will be adjacent to source and drain regions and connect to MOL contacts, while the base of power via bar 105 is the portion that is between gate ends.

Figure 2:
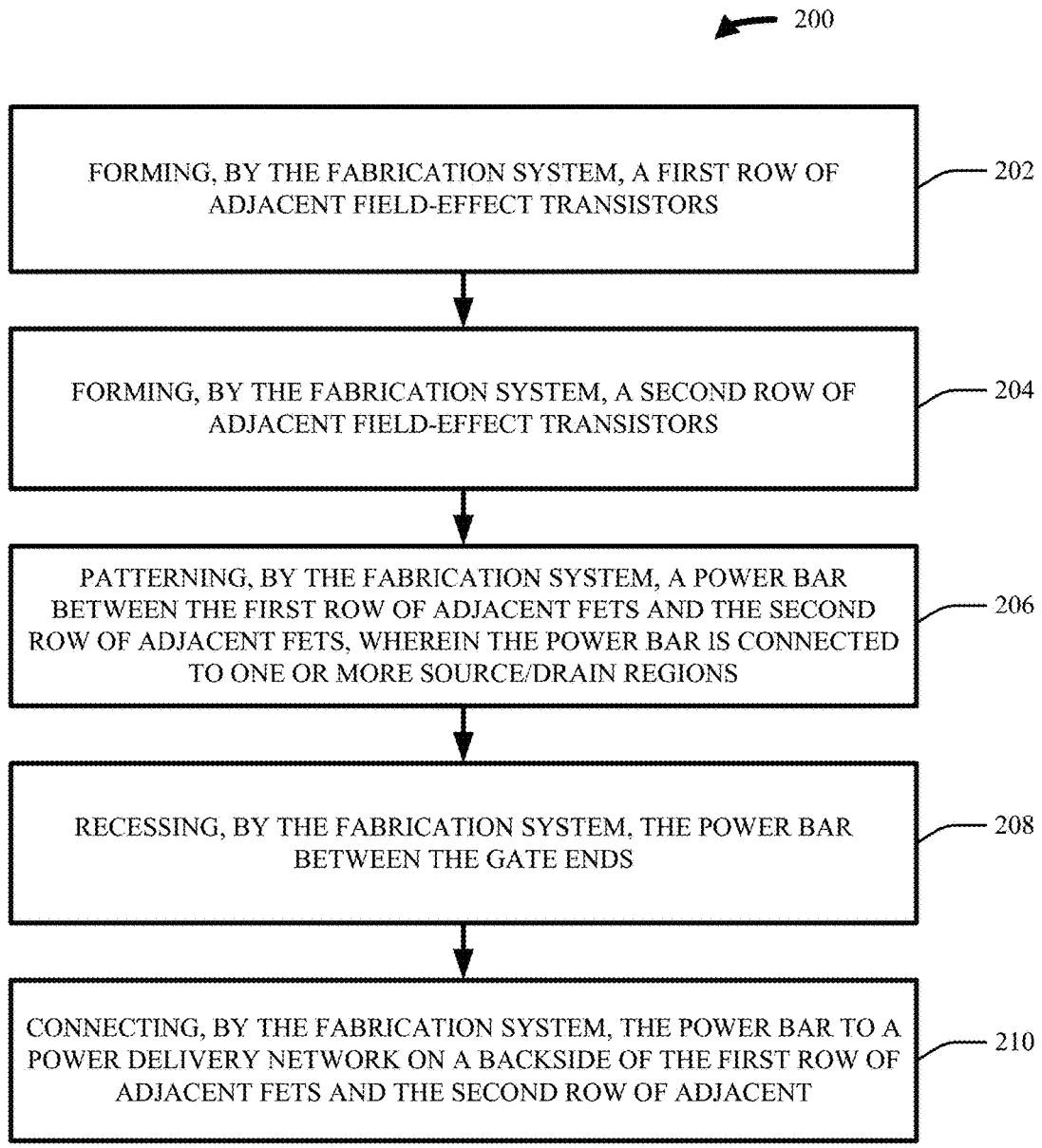
FIG. 2 illustrates a flow diagram of an example, non-limiting method of fabrication, by a fabrication system, of a semiconductor device in accordance with one or more embodiments described herein.

FIG. 2 illustrates a flow diagram of an example, non-limiting method of fabrication 200, by a fabrication system, of a semiconductor device in accordance with one or more embodiments described herein.

At 202, method 200 can comprise forming, by the fabrication system, a first row of adjacent field-effect transistor (FET)s.

At 204, method 200 can comprise forming, by the fabrication system, a second row of adjacent FETs.

At 206, method 200 can comprise patterning, by the fabrication system, a power via bar between the first row of adjacent FETs and the second row of adjacent FETs, wherein the power via bar is connected to one or more source/drain regions. For example, as described above in reference to FIG. 1C, the power via bar can connect to MOL contacts connected to source/drains.

At 208, method 200 can comprise recessing, by the fabrication system, the power via bar between gate ends of the FETs. For example, a lithography patterning followed by an etching process can be utilized to recess the power via bar at regions located between the gate ends of the first row of adjacent FETs and the second row of adjacent FETs. By recessing these regions of the power via bar, parasitic capacitance can be reduced across the gate ends, improving performance of the device.

At 210, method 200 can comprise connecting, by the fabrication system, the power via bar to a power delivery network on a backside of the first row of adjacent FETs and the second row of adjacent FETs.

FIG. 3A illustrates a top-down view of an example, non-limiting, starting substrate for production of a semiconductor device in accordance with one or more embodiments described herein. As shown, FIG. 3A illustrates a first row of FETs 303 and a second row of FETs 302 and one or more gate structures 304. The first row of FETs 303 and the second row of FETs 302, as well as the gate structure can be formed through a nanosheet transistor fabrication method or other suitable transistor fabrication methods. FIG. 3A also comprises lines 320, 330 and 340 utilized to illustrate cross-sections below.

Figures 3C, 3D:
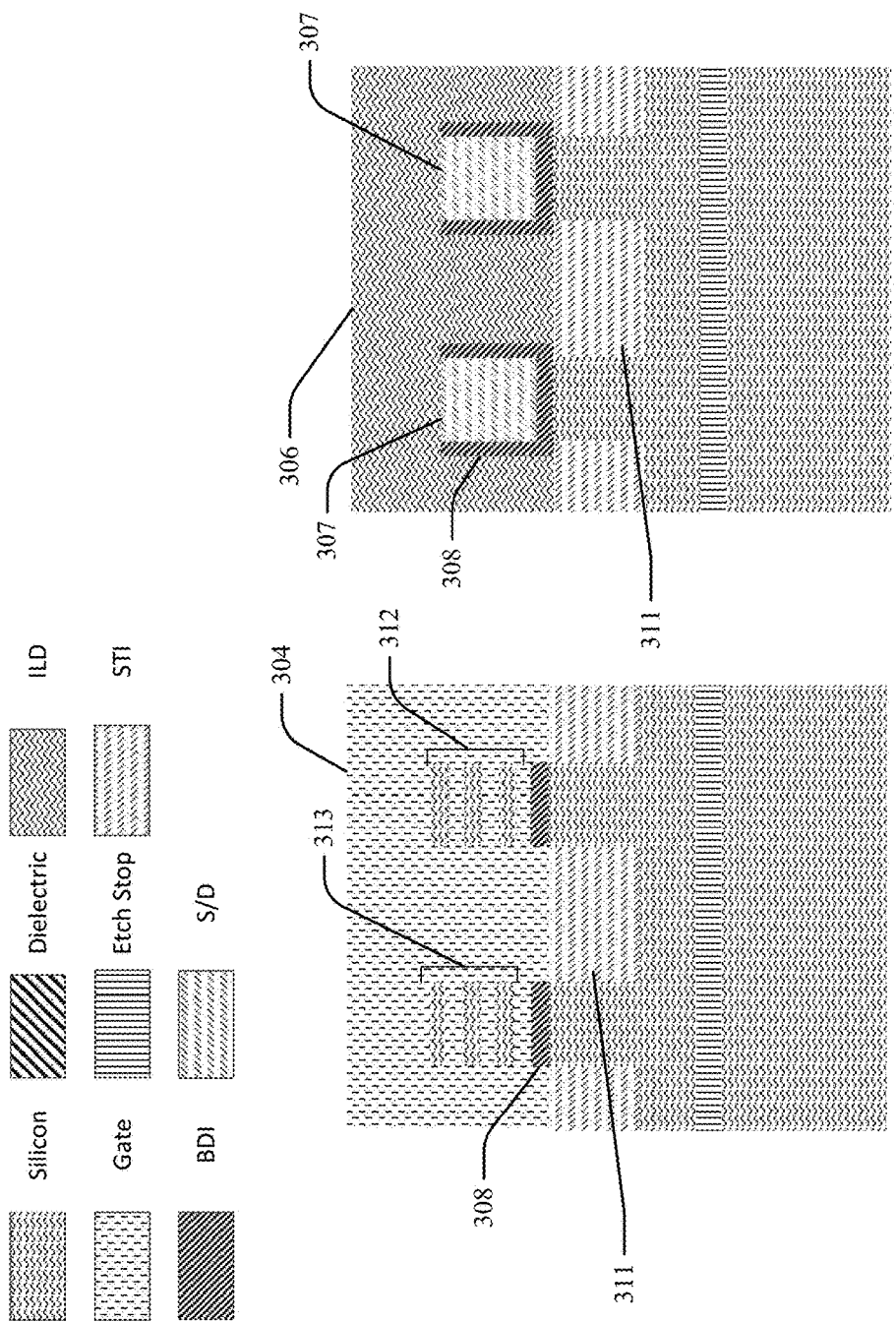

FIGS. 3B, 3C and 3D illustrate various cross-sections of a starting substrate in accordance with one or more embodiments described herein. FIG. 3B illustrates a cross-section along line 320 of FIG. 3A. As shown, FIG. 3B illustrates a silicon substrate 309, an etch stop layer 310, a bottom dielectric isolation (BDI) layer 308, one of more gate structures 304 connected to transistor layers, one or more source/drain regions 307 and ILD 306.

FIG. 3C illustrates a cross-section along line 330 of FIG. 3A. As shown, FIG. 3C comprises transistor fins 312 and 313, surrounded by metallic gate structure 304, and shallow trench isolation region (STI) 311. FIG. 3D illustrates a cross-section along line 340 of FIG. 3A. As shown, FIG. 3A comprises one or more source/drain regions 307, BDI layer 308, STI 311 and ILD 306.

Figures 4A, 4B:
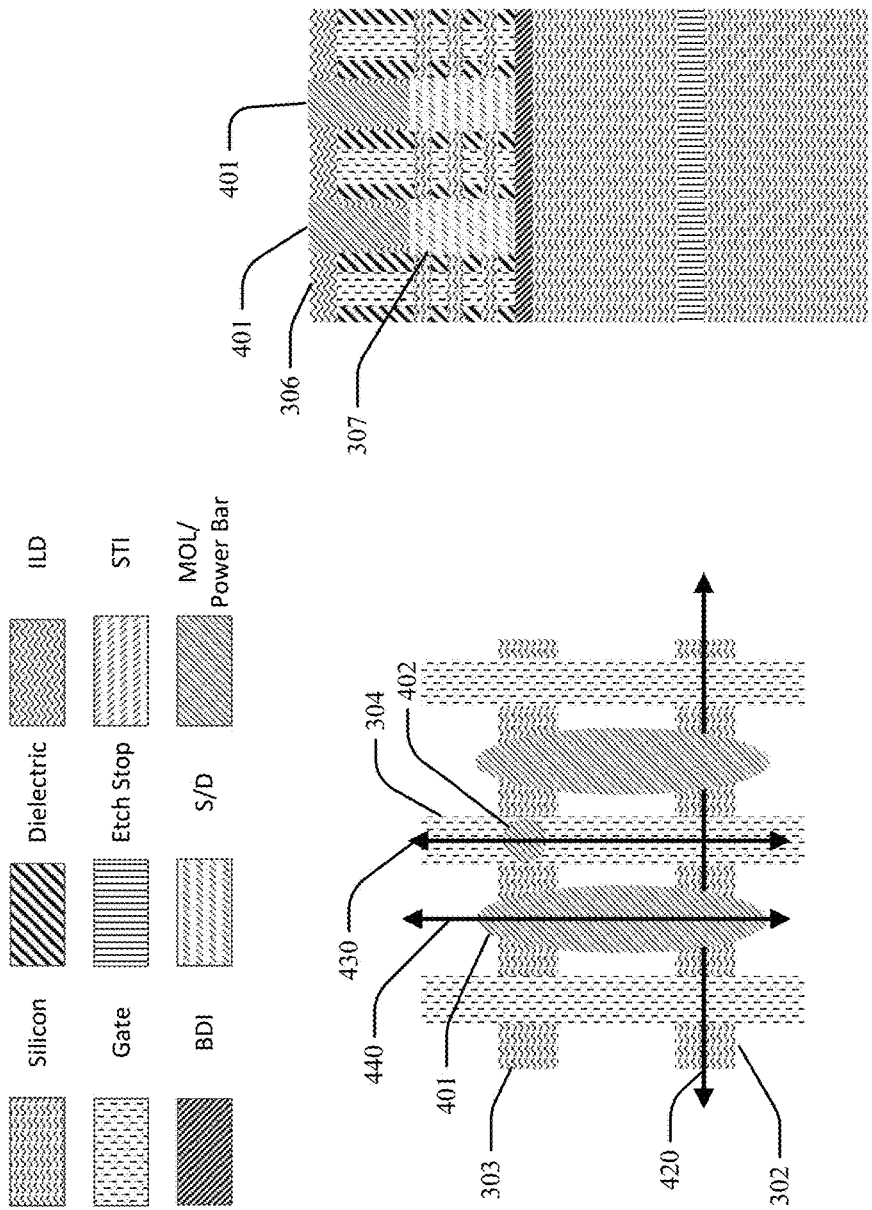
FIG. 4A illustrates a top-down view of an example, non-limiting, second stage of production of a semiconductor device in accordance with one or more embodiments described herein.
FIGS. 4B, 4C, and 4D illustrate various cross-sections of second stage of production of a semiconductor device in accordance with one or more embodiments described herein.

FIG. 4A illustrates a top-down view of an example, non-limiting, second stage of production of a semiconductor device in accordance with one or more embodiments described herein. As shown, MOL contacts 401 can be formed across the semiconductor device between the first row of FETs 303 and the second row of FETs 302 and gate contact 402 can be formed. FIG. 4A also comprises lines 420, 430 and 440 utilized to illustrate cross-sections below.

Figures 4C, 4D:
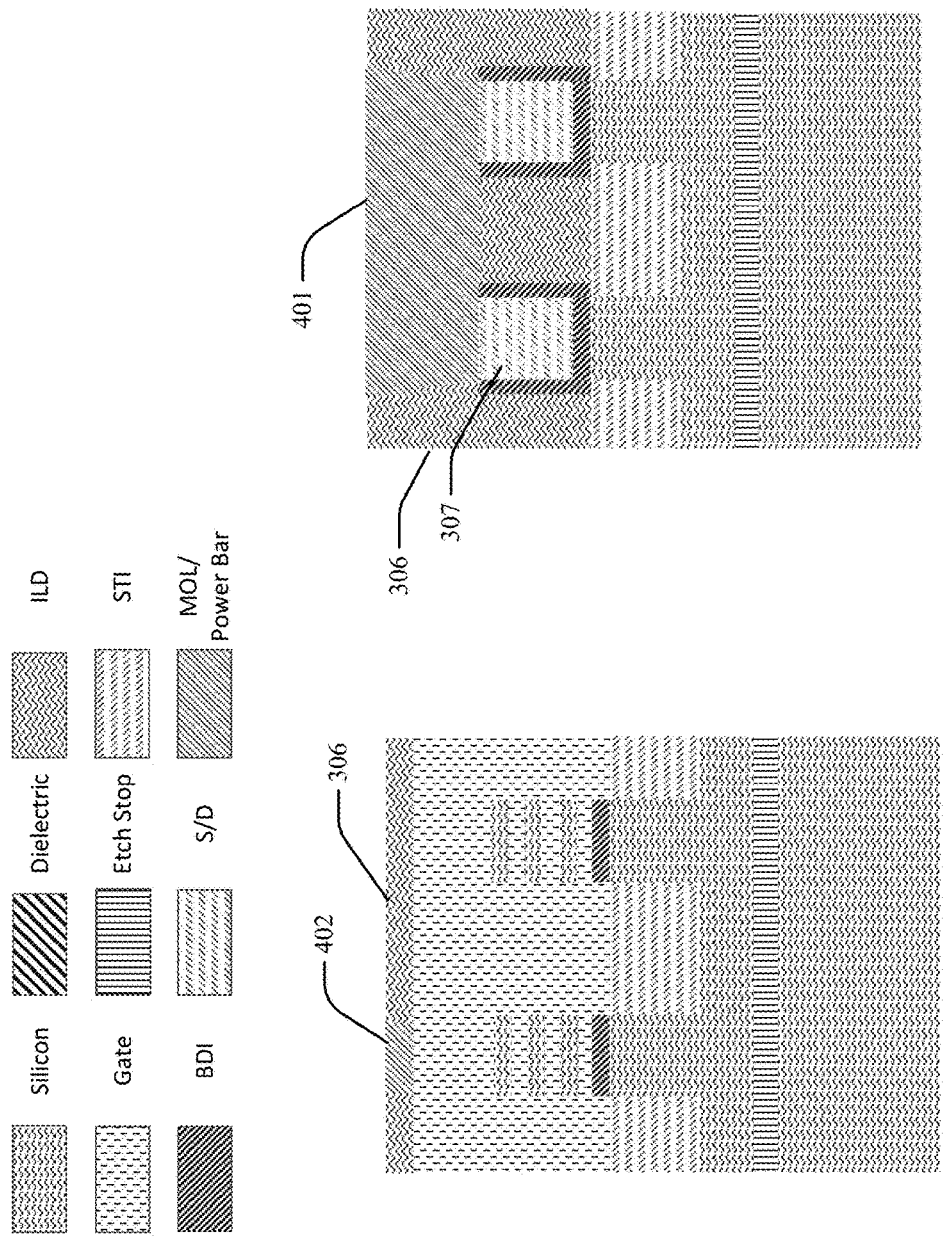

FIGS. 4B, 4C, and 4D illustrate various cross-sections of a second stage of production of a semiconductor device in accordance with one or more embodiments described herein. FIG. 4B illustrates a cross-section along line 420 of FIG. 4A. As shown by FIG. 4B, MOL contacts 401 can be formed on top of source/drain regions 307. FIG. 4C illustrates a cross-section along line 430 of FIG. 4A. As shown, gate contact 402 can be patterned on top of gate structure 304 and ILD 306 can be deposited on top of gate structure 304. FIG. 4D illustrates a cross-section along line 440 of FIG. 4A. As shown, MOL contact 401 can be formed on top of source/drain region 307 and ILD 306 can be expanded along the sides of MOL contacts 401.

Figures 5A, 5B:
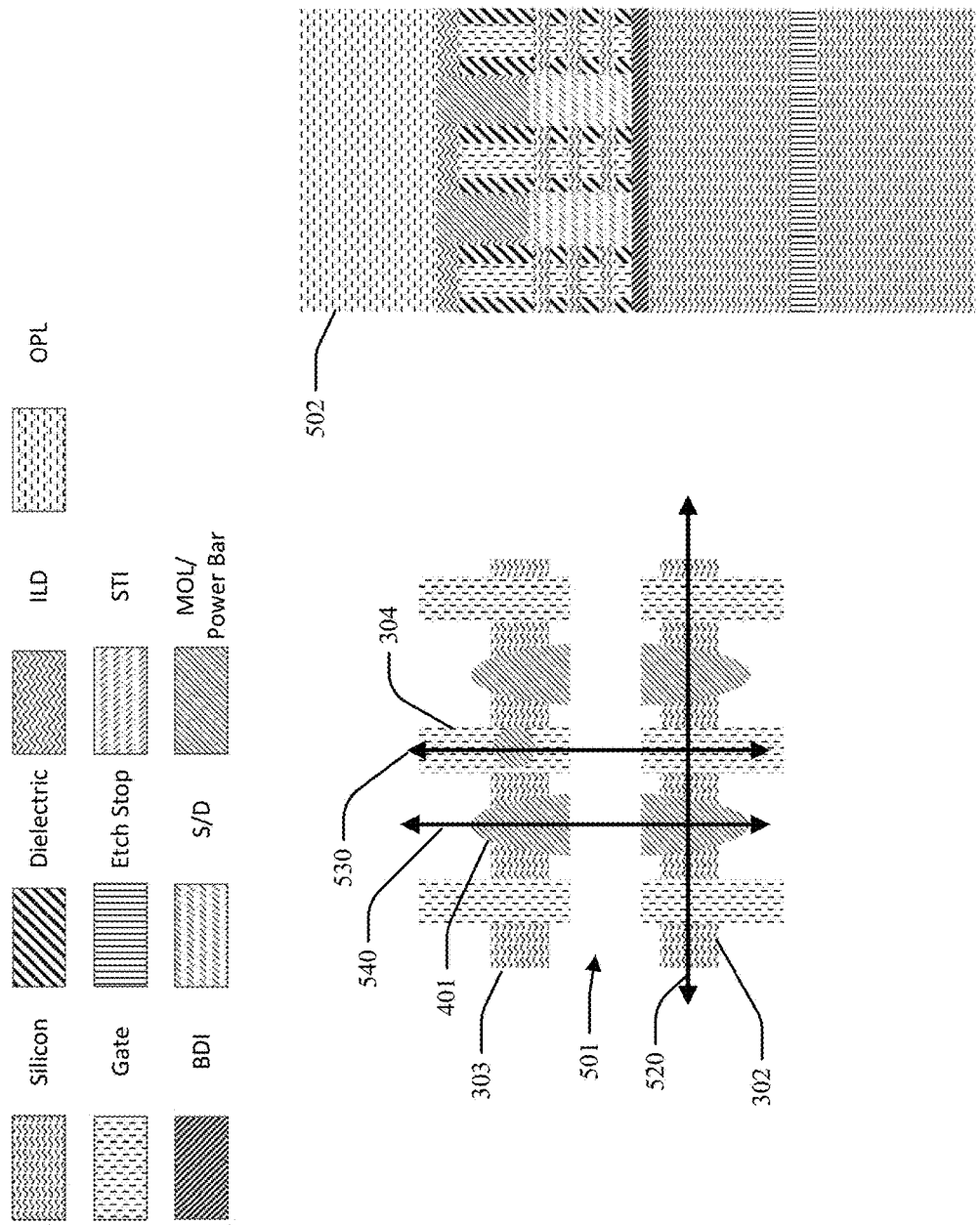
FIG. 5A illustrates a top-down view of an example, non-limiting, third stage of production of a semiconductor device in accordance with one or more embodiments described herein.
FIGS. 5B, 5C and 5D illustrate various cross-sections of a third stage of production of a semiconductor device in accordance with one or more embodiments described herein.

FIG. 5A illustrates a top-down view of an example, non-limiting, third stage of production of a semiconductor device in accordance with one or more embodiments described herein. As shown, a gate cut 501 can be pattern (e.g., through an etching process) through gate structure 304 and MOL contacts 401 between the first row of FETs 303 and the second row of FETs 302. FIG. 5A also comprises lines 520, 530 and 540 utilized to illustrate cross-sections below.

Figures 5C, 5D:
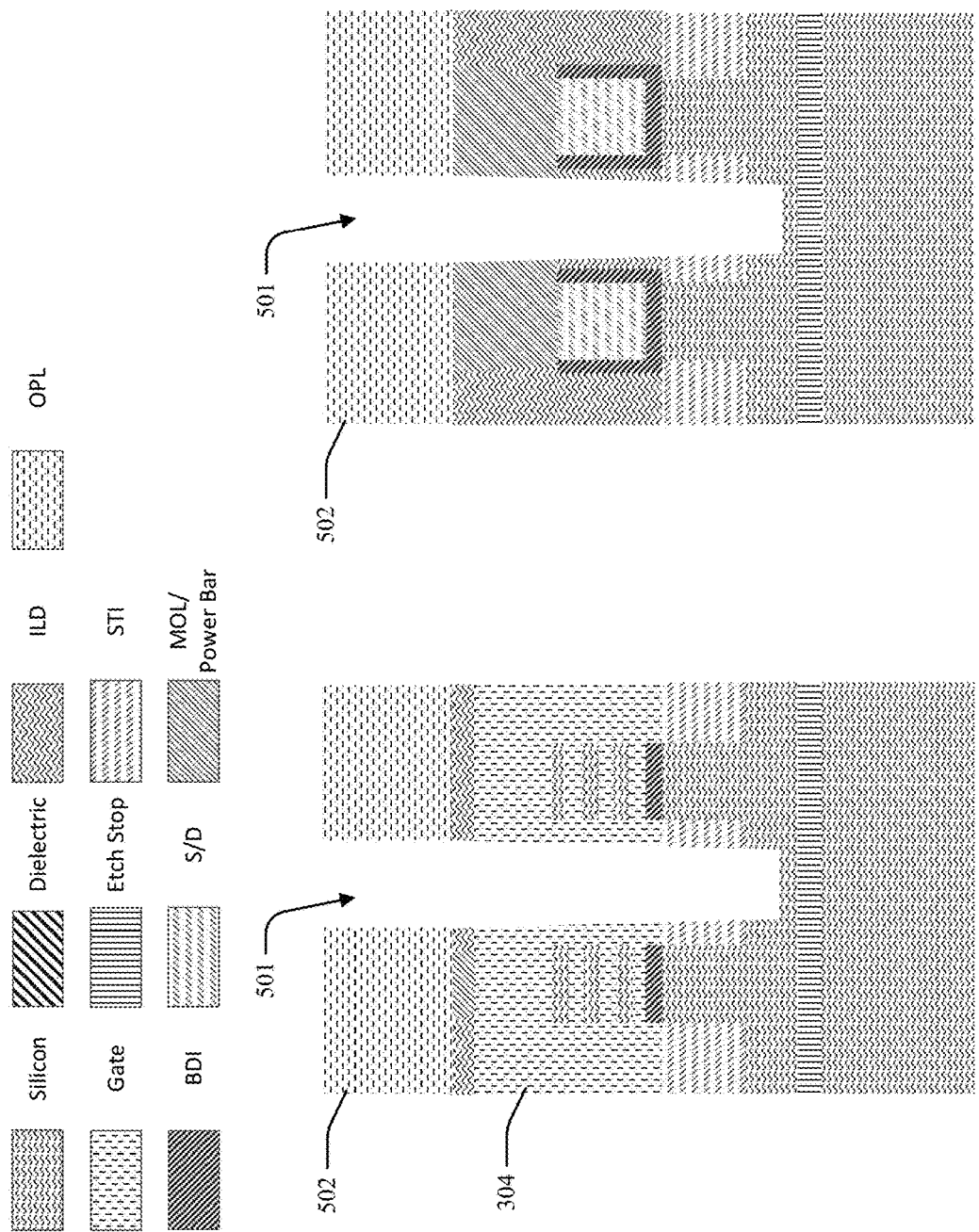

FIGS. 5B, 5C and 5D illustrate various cross-sections of a third stage of production of a semiconductor device in accordance with one or more embodiments described herein. FIG. 5B illustrates a cross-section along line 520 of FIG. 5A. As shown, a layer of patterning mask 502, such as OPL can be deposited on top of the first row of FETs 303 and the second row of FETs 302 to protect them during the gate cut process. FIG. 5C illustrates a cross-section along line 530 of FIG. 5A. As shown by FIG. 5C, gate cut 501 can cut through gate structure 304, and patterning mask layer 502 can protect areas not intended to be cut. FIG. 5D illustrates a cross-section along line 540 of FIG. 5A. As shown, gate cut 501 can cut through MOL contact 401, and patterning mask layer 502 can protect areas not intended to be cut.

FIG. 6A illustrates a top-down view of an example, non-limiting, fourth stage of production of a semiconductor device in accordance with one or more embodiments described herein. As shown, a dielectric liner 601 can be formed along the sidewalls of gate cut 501 by a conformal deposition followed by anisotropic etching process. In various embodiments, dielectric liner 601 can comprise material such as SiN, SiCO, SiOCN, or other suitable dielectric materials. FIG. 6A also comprises lines 620, 630 and 640 utilized to illustrate cross-sections below.

Figures 6C, 6D:
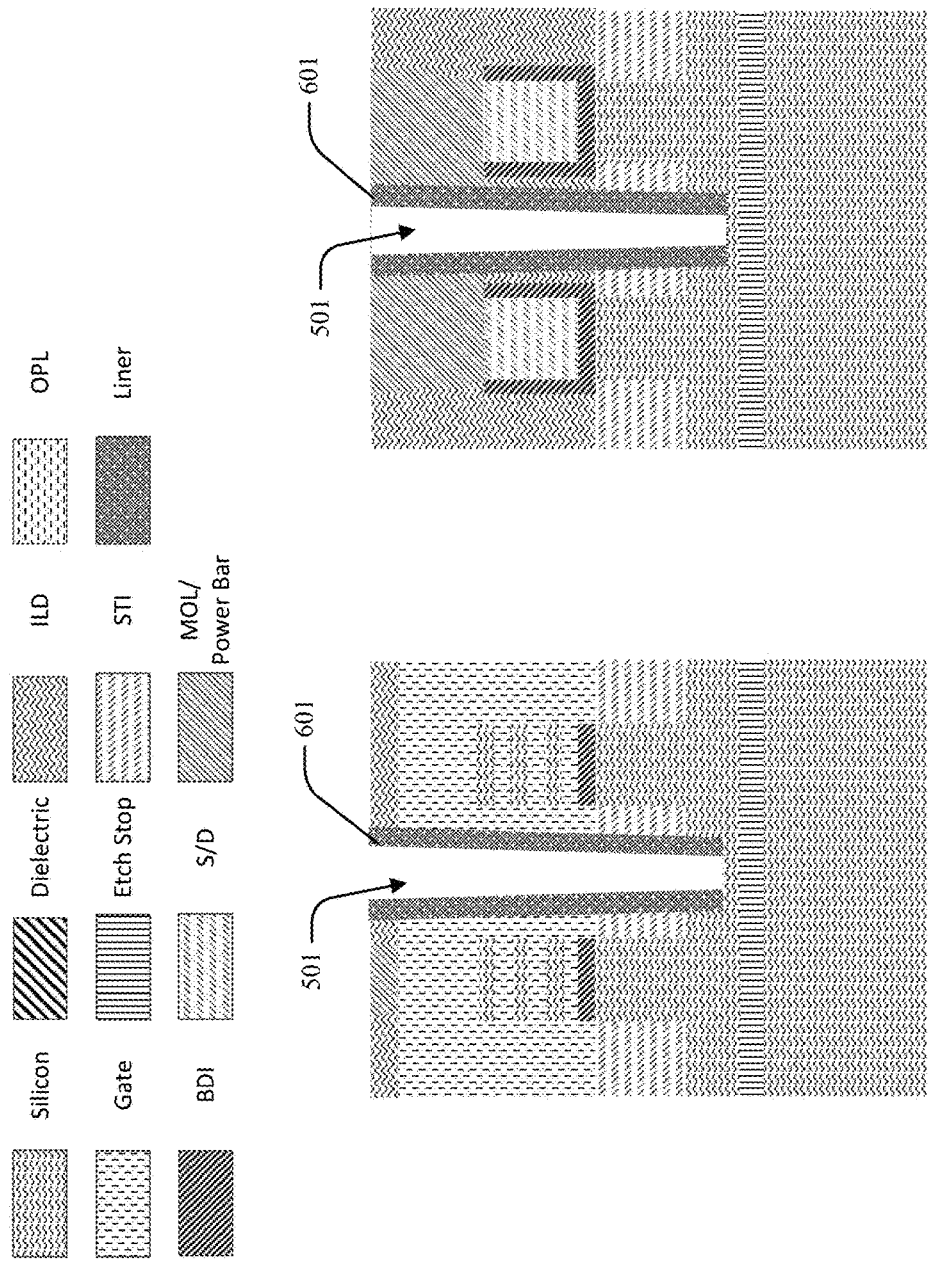

FIGS. 6B, 6C and 6D illustrate various cross-sections of a fourth stage of production of a semiconductor device in accordance with one or more embodiments described herein. FIG. 6B illustrates a cross-section along line 620 of FIG. 6A. As shown, patterning mask 502 can be removed from the first row of FETs 303 and the second row of FETs 302. FIG. 6C illustrates a cross-section along line 630 of FIG. 6A. As shown, dielectric liner 601 is formed along the sidewalls of gate cut 501. FIG. 6D illustrates a cross-section along line 640 of FIG. 6A. As shown, dielectric liner 601 is formed along the sidewalls of gate cut 501.

Figures 7A, 7B:
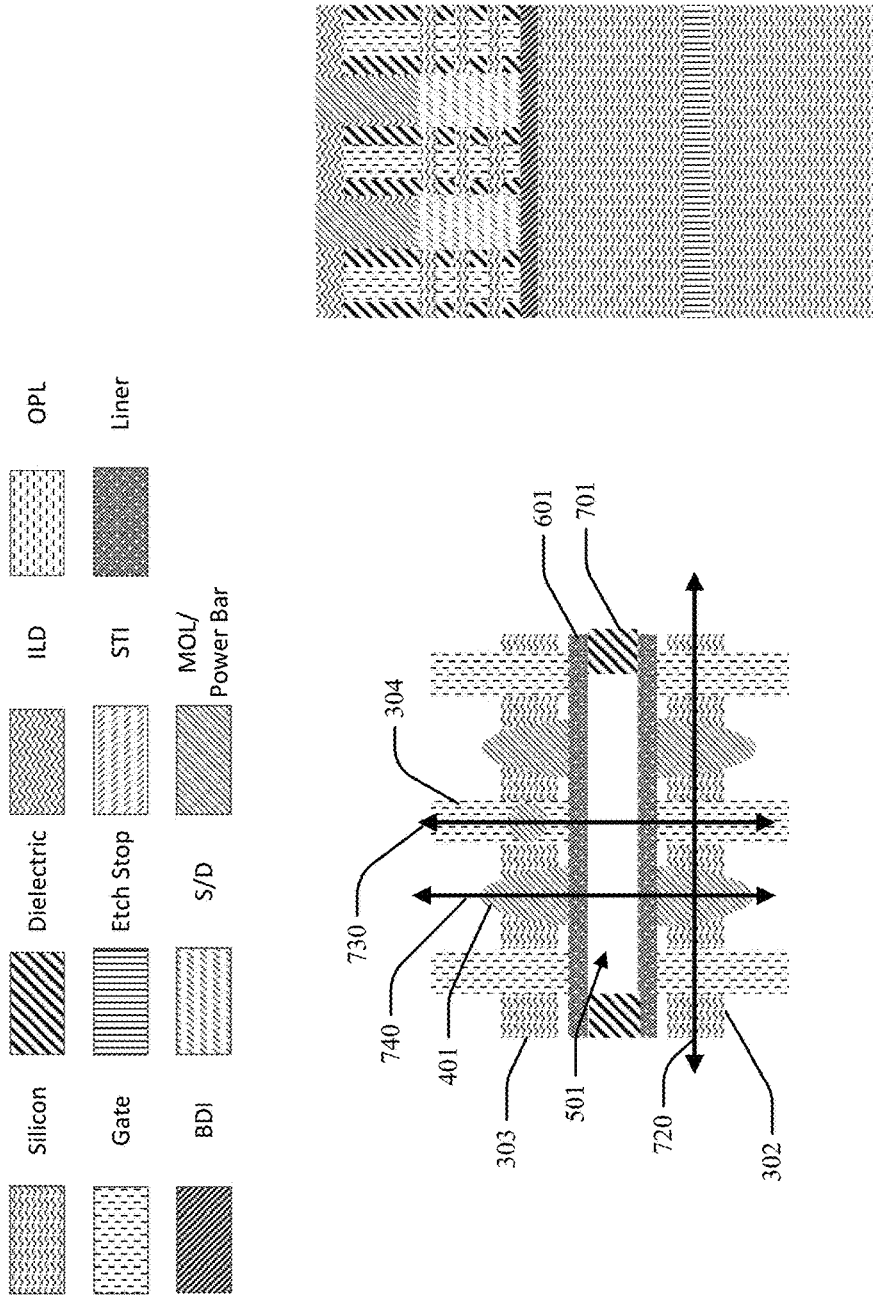
FIG. 7A illustrates a top-down view of an example, non-limiting, fifth stage of production of a semiconductor device in accordance with one or more embodiments described herein.
FIGS. 7B, 7C and 7D illustrate various cross-sections of a fifth stage of production of a semiconductor device in accordance with one or more embodiments described herein.

FIG. 7A illustrates a top-down view of an example, non-limiting, fifth stage of production of a semiconductor device in accordance with one or more embodiments described herein. As shown, dielectric 701 can be deposited some regions in gate cut 501 (e.g., so regions without dielectric 701 will become power via or power via bar). FIG. 7A also comprises lines 720, 730 and 740 utilized to illustrate cross-sections below.

Figures 7C, 7D:
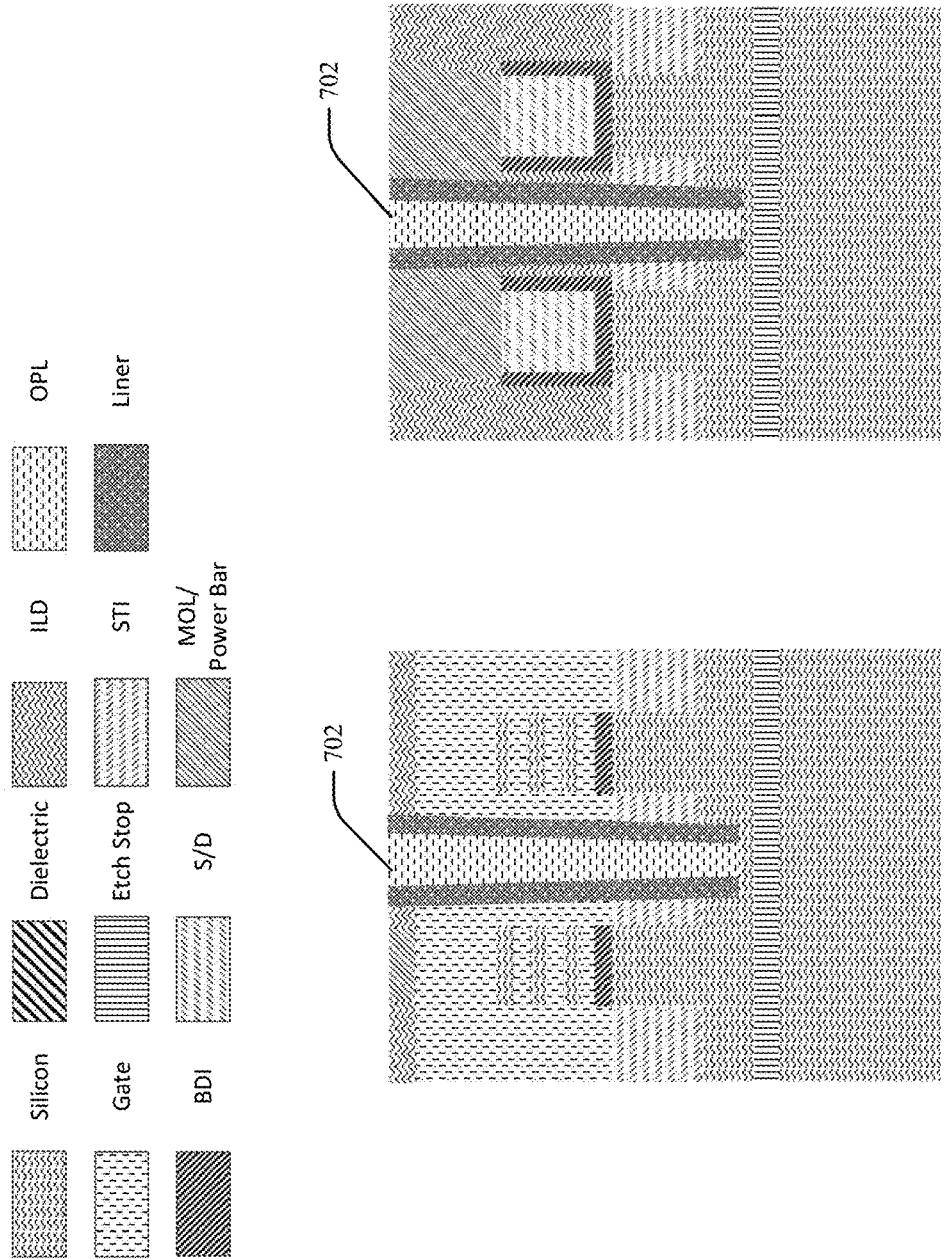

FIGS. 7B, 7C and 7D illustrate various cross-sections of a fifth stage of production of a semiconductor device in accordance with one or more embodiments described herein. FIG. 7B illustrates a cross-section along line 720 of FIG. 7A. FIG. 7C illustrates a cross-section along line 730 of FIG. 7A. As shown, OPL 702 can be deposited in gate cut 501 to prevent dielectric 701 from filling the entirety of gate cut 501. FIG. 7D illustrates a cross-section along line 740 of FIG. 7A. As shown, OPL 702 can be deposited in gate cut 501 to prevent dielectric 701 from filling the entirety of gate cut 501. A lithography patterning and etching process is used to remove OPL 702 in some regions in the gate cut 501, followed by dielectric 701 fill.

Figures 8A, 8B:
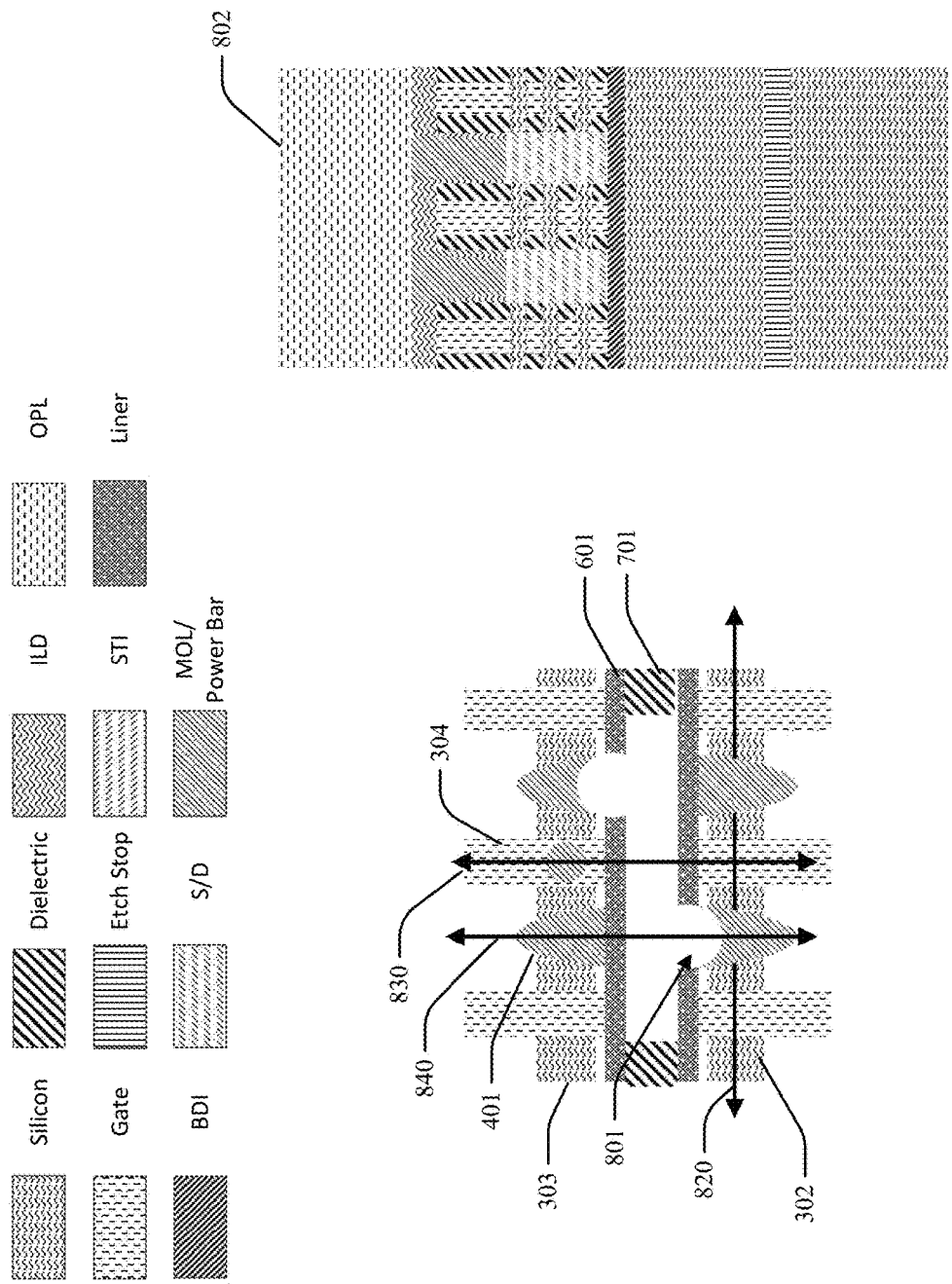

FIG. 8A illustrates a top-down view of an example, non-limiting, sixth stage of production of a semiconductor device in accordance with one or more embodiments described herein. As shown, dielectric liner cuts 801 can be formed to etch through dielectric liner 601 and expose part of MOL contacts 401. FIG. 8A also comprises lines 820, 830 and 840 utilized to illustrate cross-sections below.

FIGS. 8B, 8C and 8D illustrate various cross-sections of a sixth stage of production of a semiconductor device in accordance with one or more embodiments described herein. FIG. 8B illustrates a cross-section along line 820 of FIG. 8A. As shown, by FIG. 8B. OPL layer 802 can be deposited on top of the first row of FETs 303 and the second row of FETs 302 to protect them during the dielectric liner cut etching process. FIG. 8C illustrates a cross-section along line 830 of FIG. 8A. As shown by FIG. 8C, OPL layer 802 can be deposited on top of gate structure 304 to protect the gate structure during the dielectric liner cut process. FIG. 8D illustrates a cross-section along line 840 of FIG. 8A. As shown, dielectric liner cut 801 can be formed to etch through dielectric liner 601 to expose a portion of MOL contact 401.

FIG. 9A illustrates a top-down view of an example, non-limiting, seventh stage of production of a semiconductor device in accordance with one or more embodiments described herein. As shown, OPL layer 802 can be removed and power via bar 901 can be deposited (e.g., through a metallization process) within gate cut 501 and dielectric liner cuts 801. FIG. 9A also comprises lines 920, 930 and 940 utilized to illustrate cross-sections below.

Figures 9C, 9D:
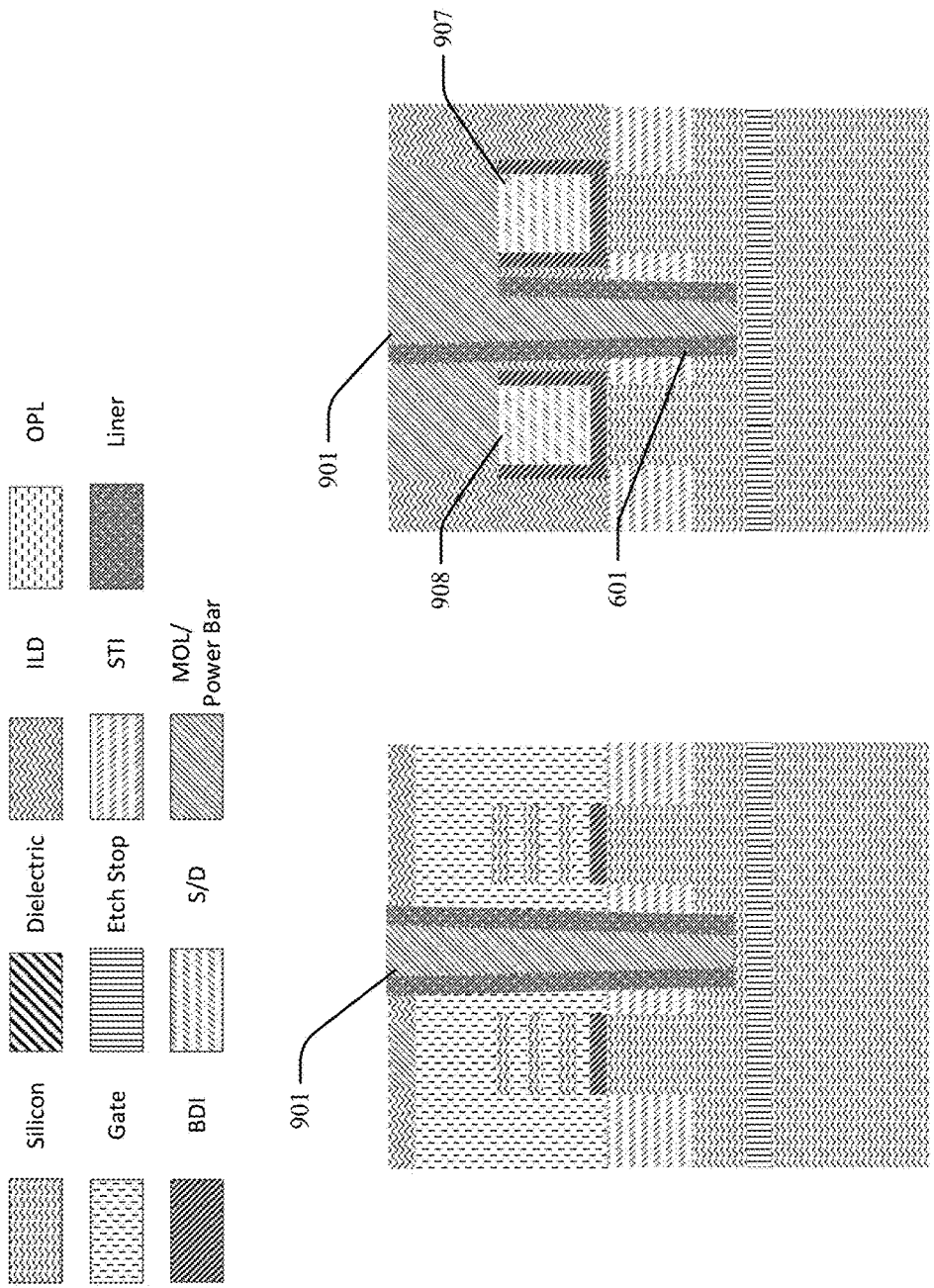

FIGS. 9B, 9C and 9D illustrate various cross-sections of a seventh stage of production of a semiconductor device in accordance with one or more embodiments described herein. FIG. 9B illustrates a cross-section along line 920 of FIG. 9A. As shown by FIG. 9B, OPL layer 802 can be removed. FIG. 9C illustrates a cross-section along line 930 of FIG. 9A. As shown by FIG. 9C, power via bar 901 can be deposited within gate cut 501. It should be appreciated that at this stage, power via bar would produce substantial parasitic capacitance across the ends of gate structure 304. FIG. 9D illustrates a cross-section along line 940 of FIG. 9A. As shown by FIG. 9D, power via bar 901 can be deposited in gate cut 501 and dielectric liner cut 801. It should be appreciated that as shown, power via bar 901 is now connected to source/drain 907 and is isolated from the source/drain 908 region by dielectric liner 601 that is not cut.

Figure 10A:
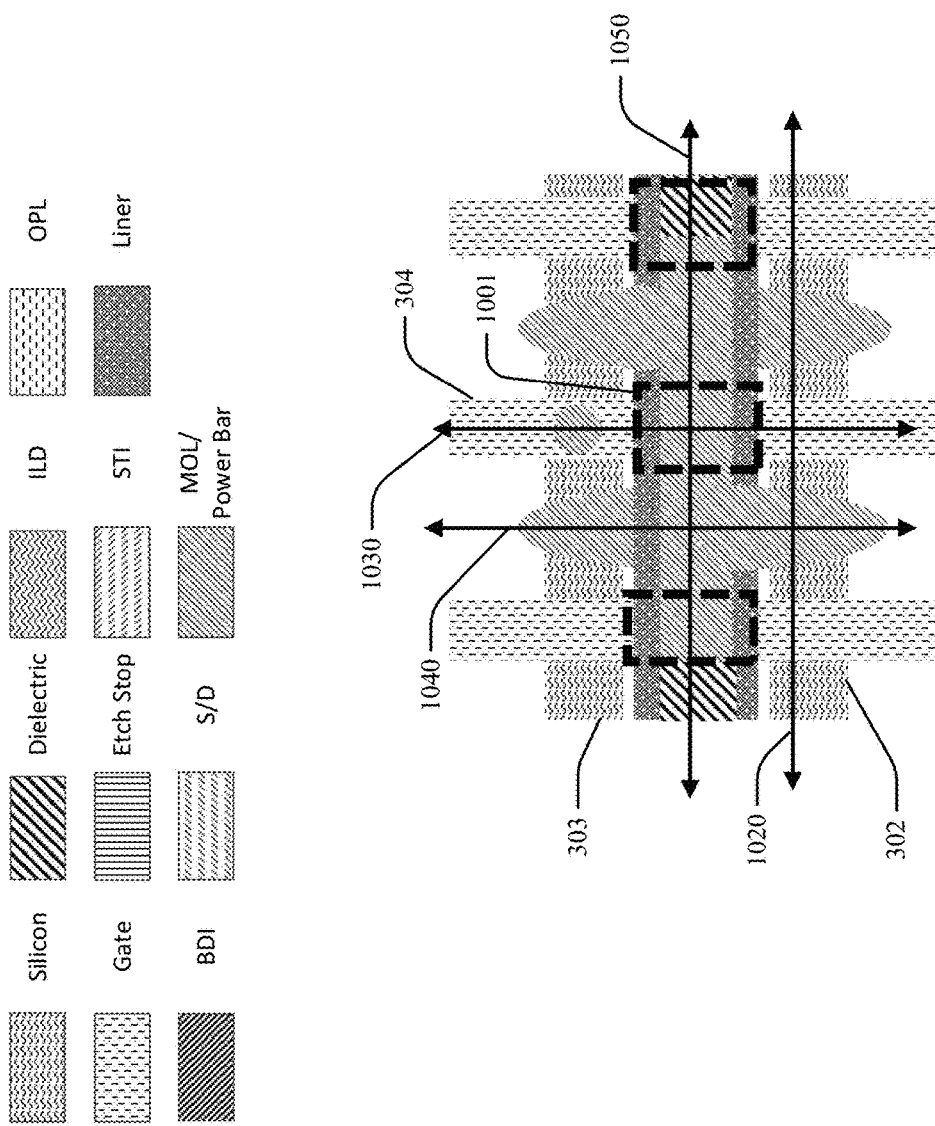
FIG. 10A illustrates a top-down view of an example, non-limiting, eighth stage of production of a semiconductor device in accordance with one or more embodiments described herein.

FIG. 10A illustrates a top-down view of an example, non-limiting, eighth stage of production of a semiconductor device in accordance with one or more embodiments described herein. As shown, FIG. 10A illustrates region 1001 wherein power via bar 901 will be recessed (e.g., the region between the ends of gate structure 304). Accordingly, a patterning mask layer pattern can be formed on the semiconductor device covering all portions that will not be recessed. FIG. 10A also comprises lines 1020, 1030, 1040 and 1050 utilized to illustrate cross-sections below.

Figures 10B, 10C:
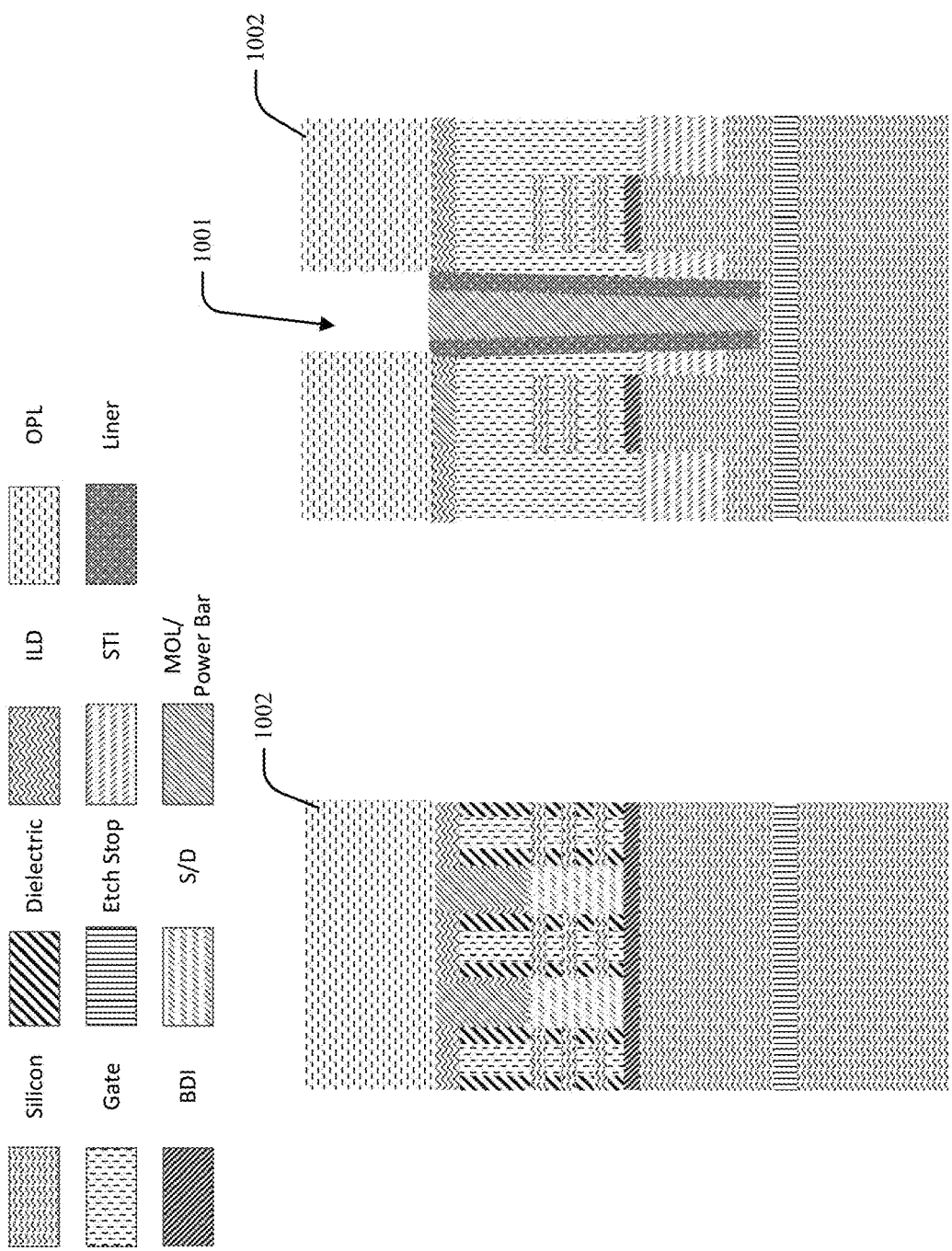
FIGS. 10B, 10C, 10D and 10E illustrate various cross-sections of an eighth stage of production of a semiconductor device in accordance with one or more embodiments described herein.
Figures 10D, 10E:
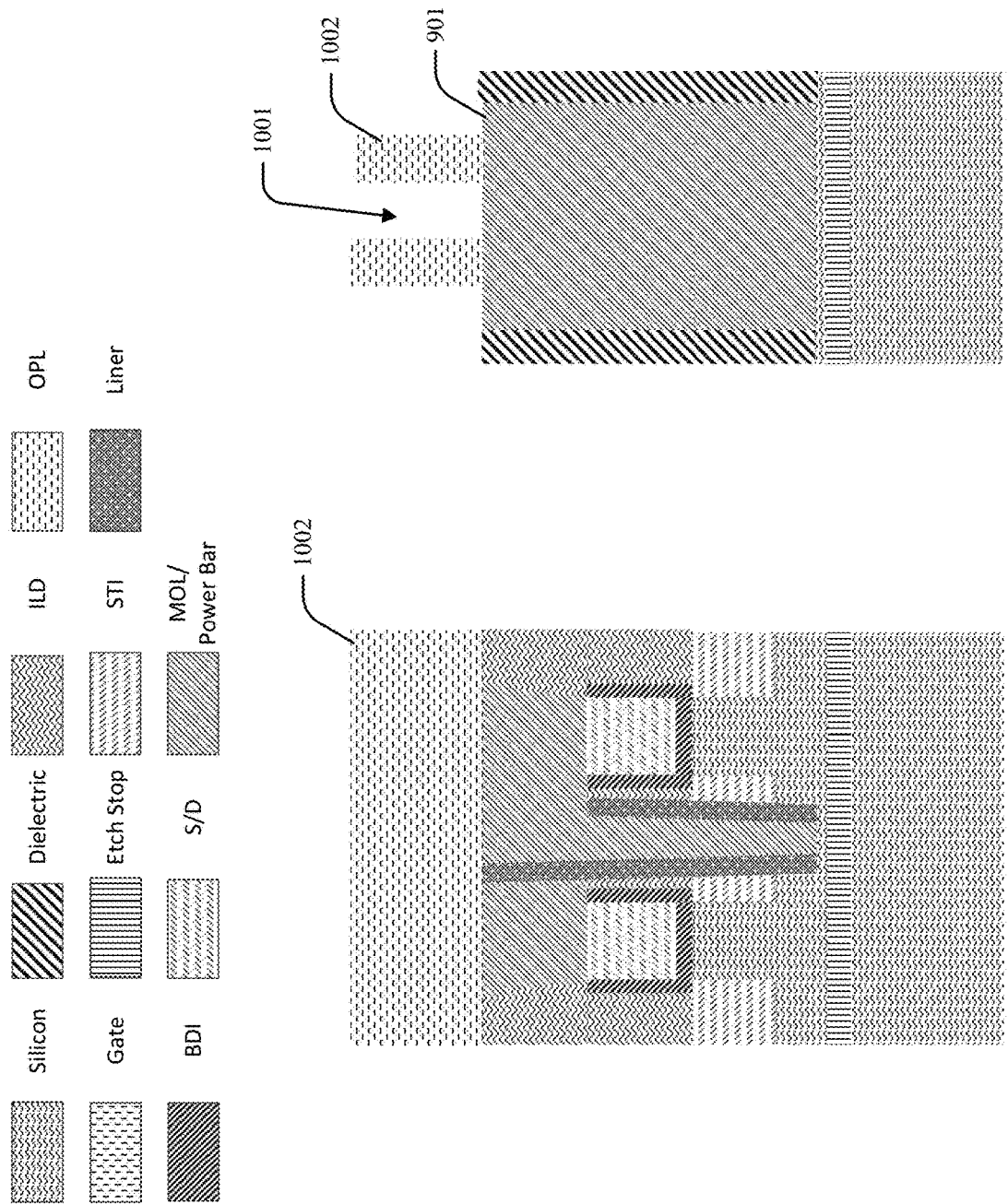

FIGS. 10B, 10C, 10D and 10E illustrate various cross-sections of an eighth stage of production of a semiconductor device in accordance with one or more embodiments described herein. FIG. 10B illustrates a cross-section along line 1020 of FIG. 10A. As shown by FIG. 10B, patterning mask layer 1002 (such as OPL) can be deposited on top of the first row of FETs 303 and the second row of FETs 302 to protect them during the power via bar recess process. FIG. 10C illustrates a cross-section along line 1030 of FIG. 10A. As shown by FIG. 10C, a gap 1001 can be left within patterning mask layer 1002 marking wherein power via bar 901 will be recessed. It should be appreciated that gaps in patterning mask layer 1002 can be left between each gate structure connecting the first row of FETs 303 to the second row of FETs 302. FIG. 10D illustrates a cross-section along line 1040 of FIG. 10A. As shown by FIG. 10D, the portion of power via bar 901 adjacent to source/drain regions 307 is covered by patterning mask layer 1002 to prevent the power via bar 901 from being recessed. FIG. 10E illustrates a cross-section along line 1050 of FIG. 10A. As shown by FIG. 10E, gap 1001 is left within patterning mask layer 1002 to allow the power via bar 901 to be recessed within the gap 1001.

Figures 11A, 11B:
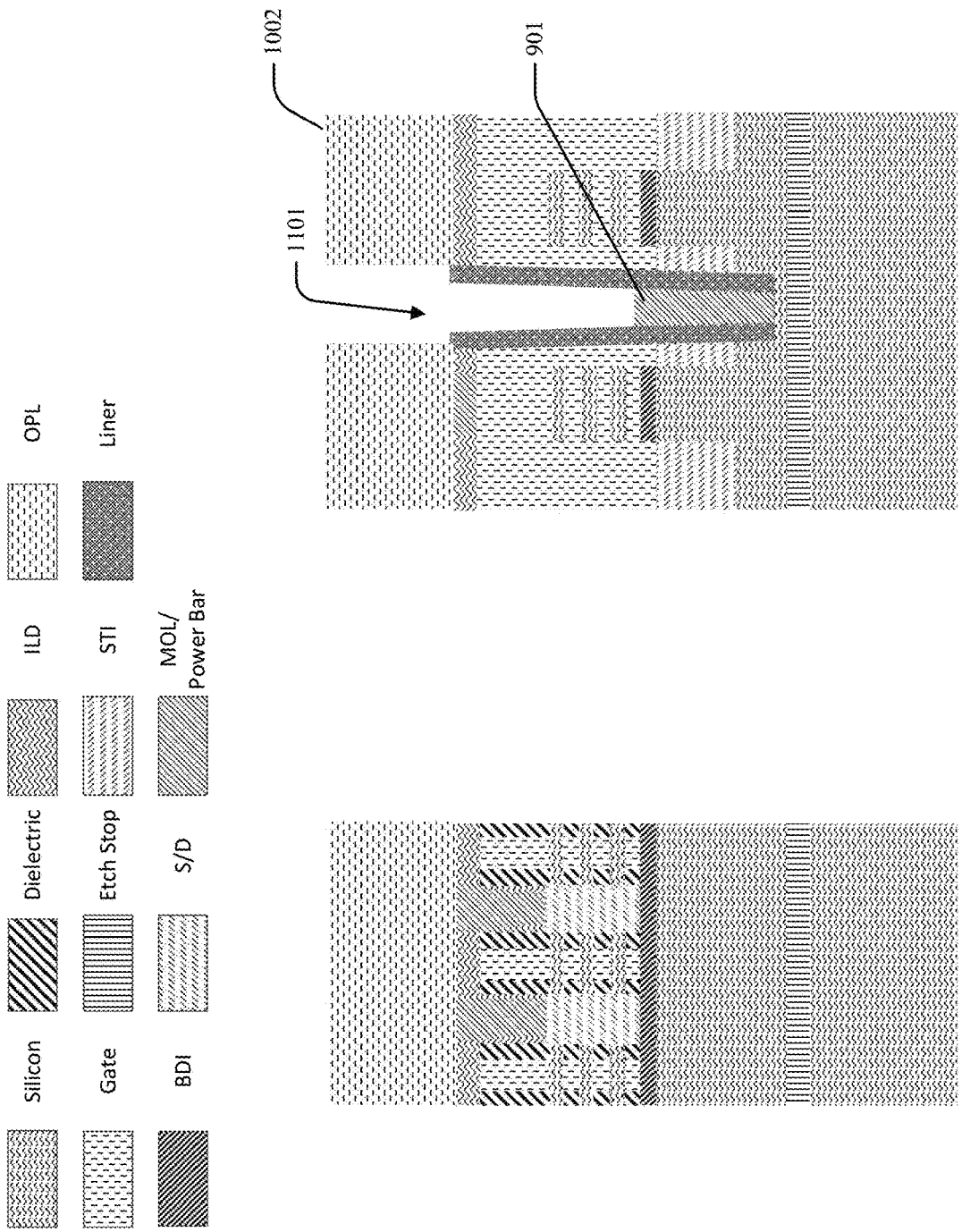
FIGS. 11A, 11B, 11C and 11D illustrate various cross-sections of a ninth stage of production of a semiconductor device in accordance with one or more embodiments described herein.
Figures 11C, 11D:
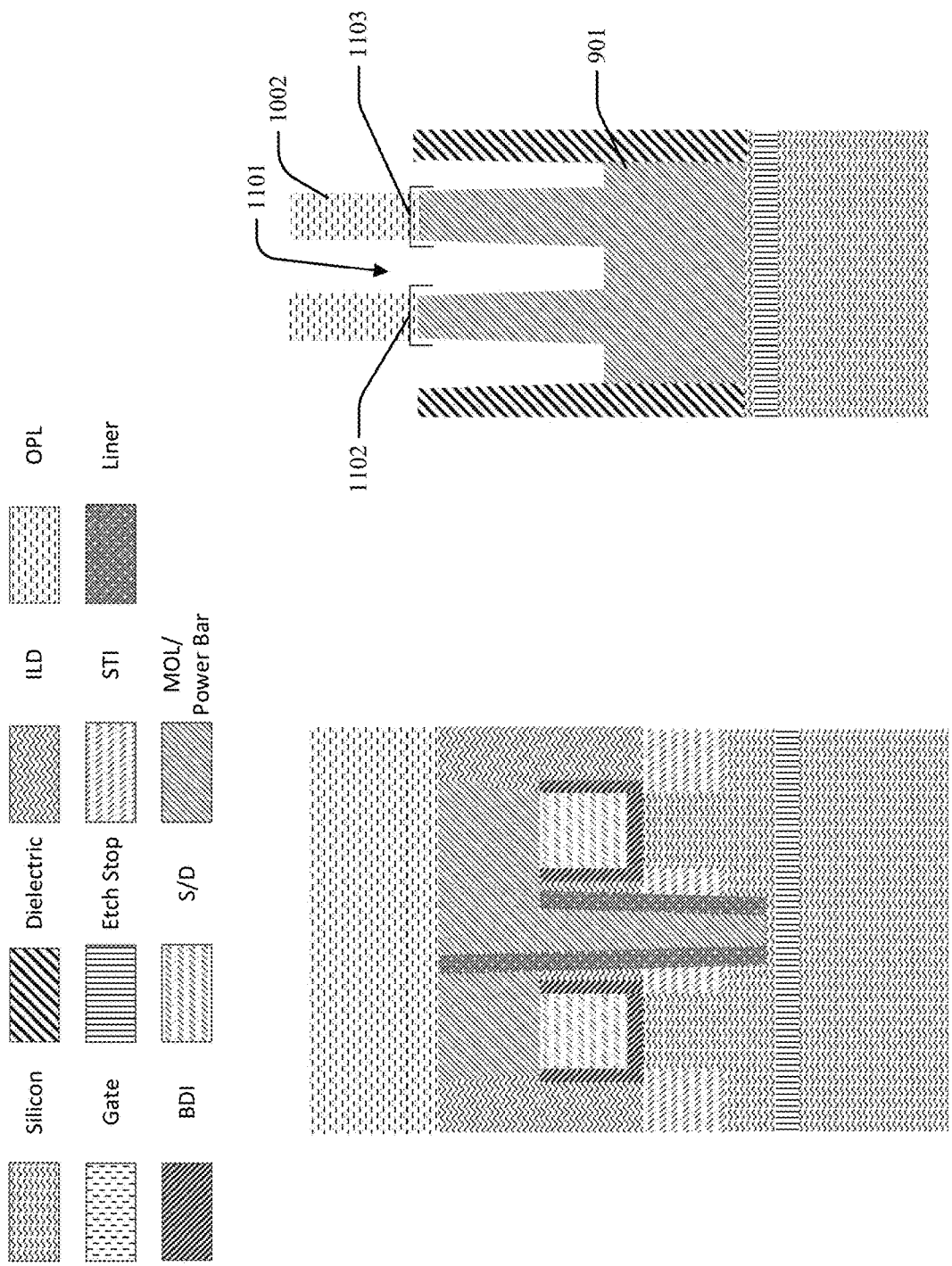

FIGS. 11A, 11B, 11C and 11D illustrate various cross-sections of a ninth stage of production of a semiconductor device in accordance with one or more embodiments described herein. FIG. 11A illustrates a cross-section along line 1020 of FIG. 10A. As shown by FIG. 11A, patterning mask layer 1002 protects the first row of FETs 303 and the second row of FETs 302 during the power via bar recess process. FIG. 11B illustrates a cross-section along line 1030 of FIG. 10A. As shown, power via bar 901 has been recessed to form a cavity 1101, as this portion of power via bar 901 was not covered by OPL layer 1002. FIG. 11C illustrates a cross-section along line 1040 of FIG. 10A. As shown by FIG. 11C, the portion of power via bar 901 adjacent to source/drain regions 307 was protected by OPL layer 1002 and was not recessed. FIG. 11D illustrates a cross-section along line 1050 of FIG. 10A. As shown, the portions of power via bar 901 covered by OPL layer 1002 were not recessed, forming cavities 1101 between a first fin 1102 and a second fin 1103. Accordingly, it should be appreciated that power via bar 901 now comprises a first height (e.g., where power via bar 901 was recessed) and a second height (e.g., the first fin 1102 and the second fin 1103).

Figure 12A:
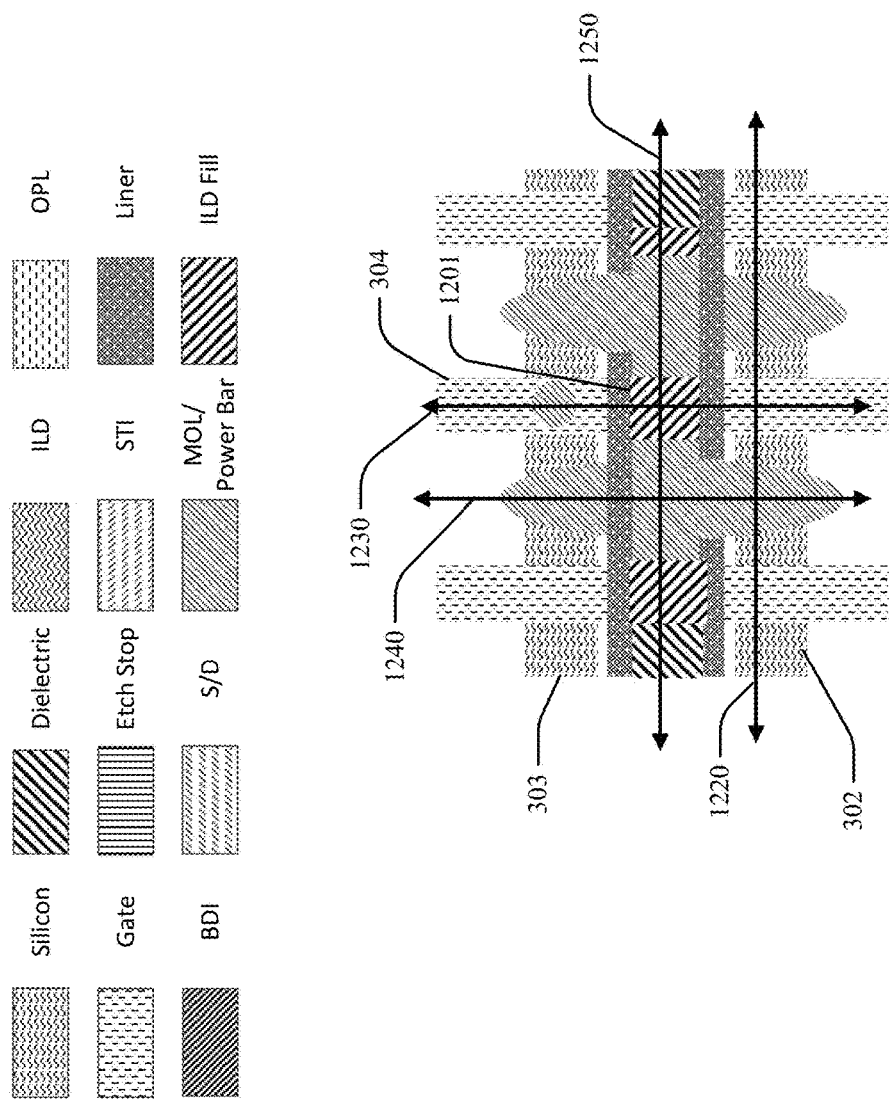
FIG. 12A illustrates a top-down view of an example, non-limiting, tenth stage of production of a semiconductor device in accordance with one or more embodiments described herein.

FIG. 12A illustrates a top-down view of an example, non-limiting, tenth stage of production of a semiconductor device in accordance with one or more embodiments described herein. As shown, ILD 1201 can be deposited on top of the semiconductor device, thereby filling cavity 1101 where power via bar 901 has been recessed. FIG. 12A also comprises lines 1220, 1230, 1240 and 1250 utilized to illustrate cross-sections below.

Figures 12B, 12C:
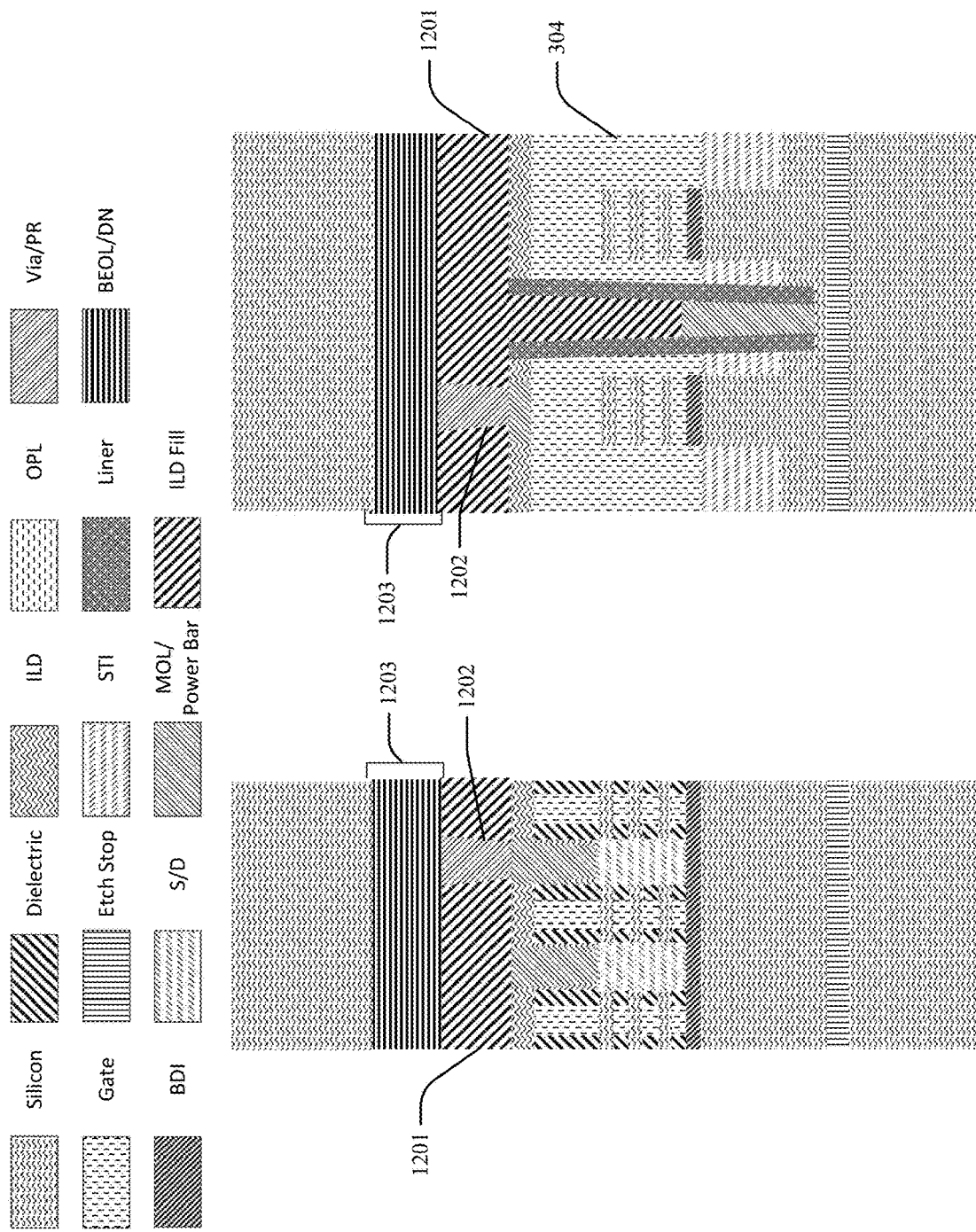
FIGS. 12B, 12C, 12D and 12E illustrate various cross-sections of a tenth stage of production of a semiconductor device in accordance with one or more embodiments described herein.
Figures 12D, 12E:
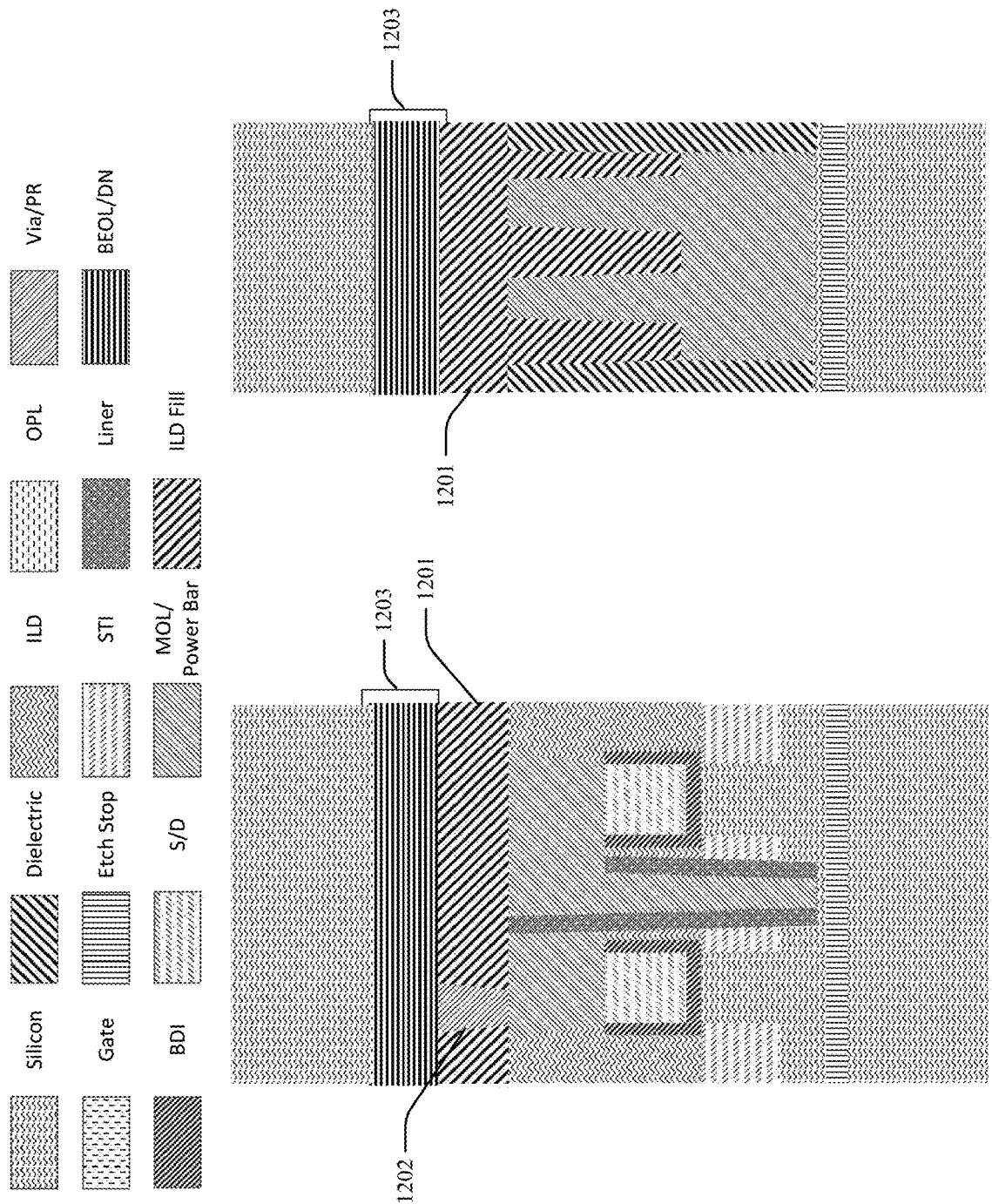
Figures 13A, 13B:
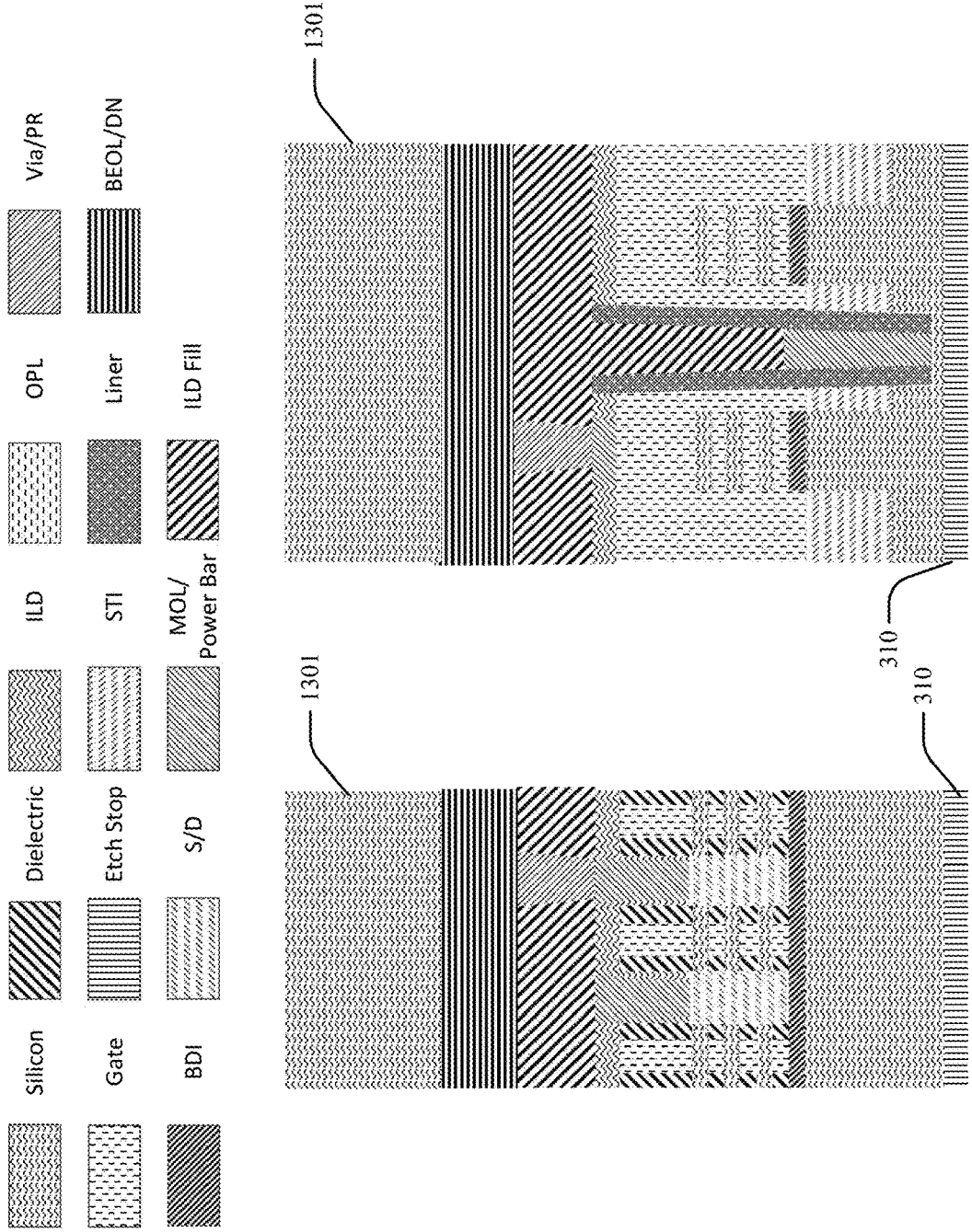
FIGS. 13A, 13B, 13C and 13D illustrate various cross-sections of an eleventh stage of production of a semiconductor device in accordance with one or more embodiments described herein.
Figures 13C, 13D:
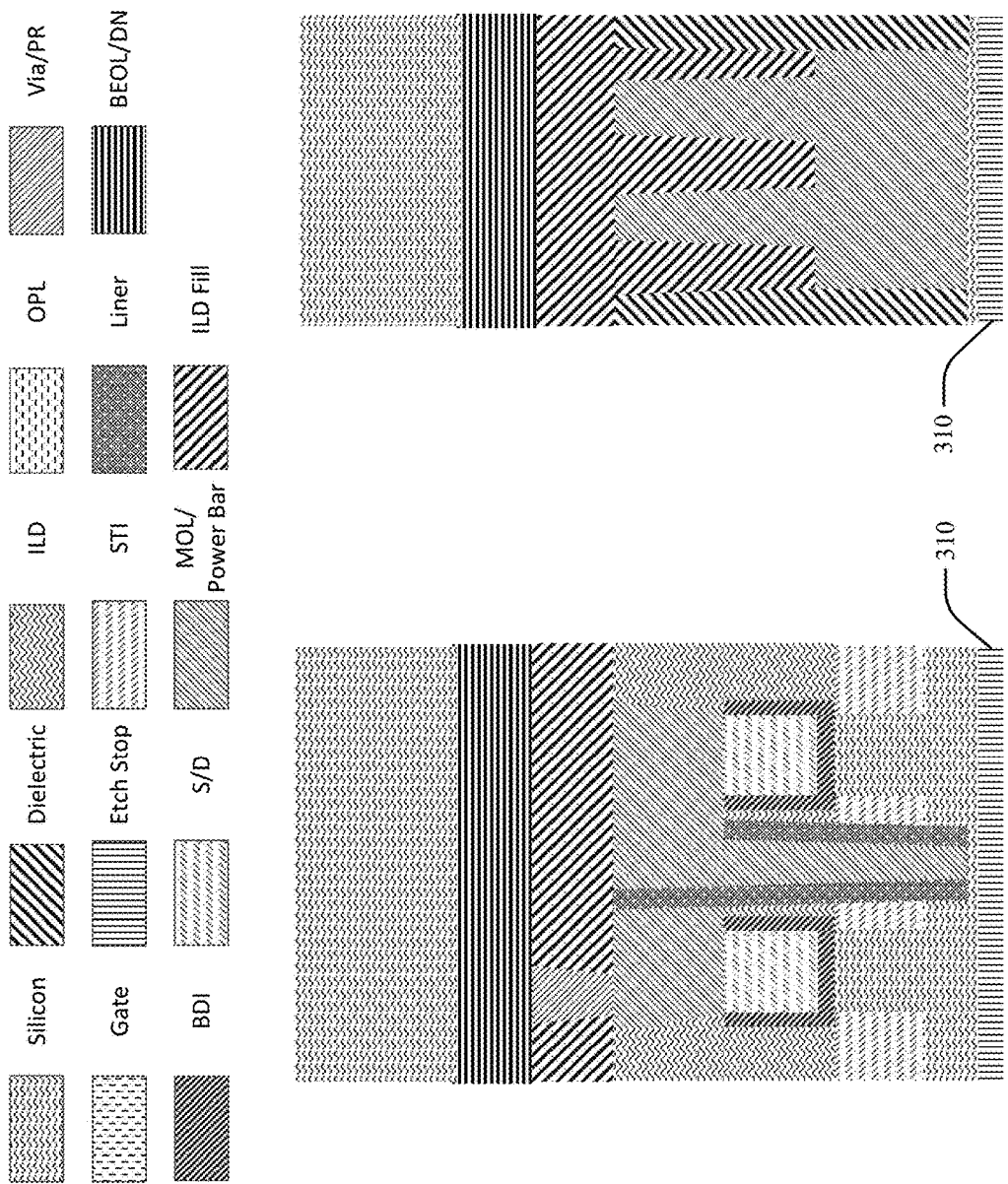
Figures 14C, 14D:
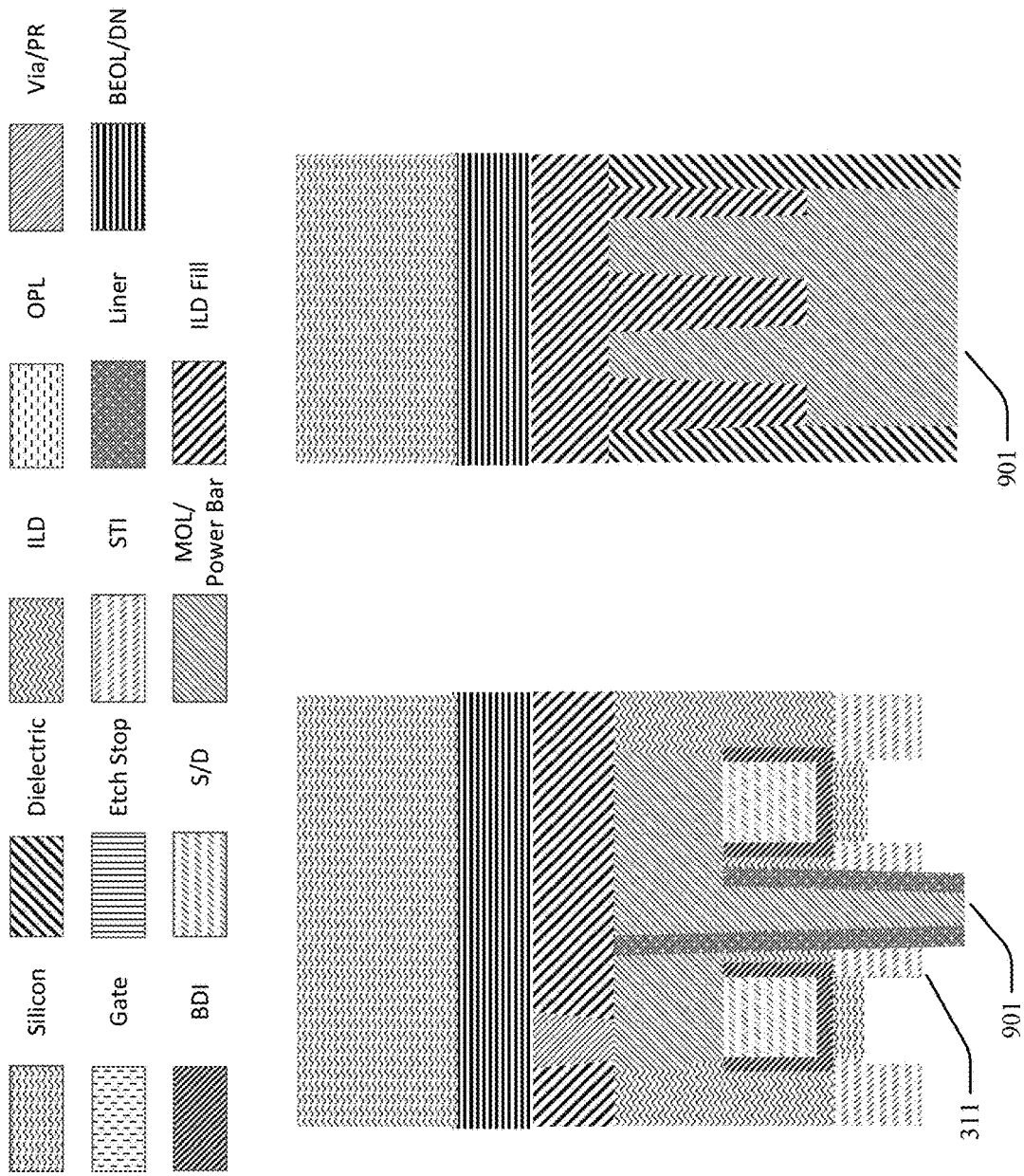

FIGS. 12B, 12C, 12D and 12E illustrate various cross-sections of a tenth stage of production of a semiconductor device in accordance with one or more embodiments described herein. FIG. 12B illustrates a cross-section along line 1220 of FIG. 12A. As shown, ILD 1201 can be deposited on the first row of FETs 303 and the second row of FETs 302. Further one or more vias 1202 can be formed to connect MOL contacts 401 and gate contact 402 to a back end of line formation (BEOL) 1203. FIG. 12C illustrates a cross-section along line 1230 of FIG. 12A. As shown, ILD 1201 can be deposited on top of gate structure 304 and on top of power via bar 901. FIG. 12D illustrates a cross-section along line 1240 of FIG. 12A. As shown by FIG. 12D, ILD 1201 is deposited on top of MOL contacts 401 and power via bar 901. FIG. 12E illustrates a cross-section along line 1250 of FIG. 12A. As shown, the ILD 1201 is deposited on top of power via bar 901, filling the space between the first fin 1102 and the second fin 1103. After BEOL 1203 formation, a substrate 1301 is bonded to the BEOL layers to allow wafer flip and backside processing, FIGS. 13A, 13B, 13C and 13D illustrate various cross-sections of an eleventh stage of production of a semiconductor device in accordance with one or more embodiments described herein. FIGS. 13A, 13B, 13C and 13D illustrates cross-sections along lines 1220, 1230, 1240 and 1250 respectively of FIG. 12A. As shown, the semiconductor device can be flipped onto substrate 1301 and substrate 309 can be etched away to reveal etch stop layer 310.

FIGS. 14A, 14B, 14C and 14D illustrate various cross-sections of a twelfth stage of production of a semiconductor device in accordance with one or more embodiments described herein. FIGS. 14A, 14B, 14C and 14D illustrates cross-sections along lines 1220, 1230, 1240 and 1250 respectively of FIG. 12A. As shown, etch stop layer 310 can be removed and further etching can be performed to expose STI regions 311 and the bottom of power via bar 901.

Figures 15A, 15B:
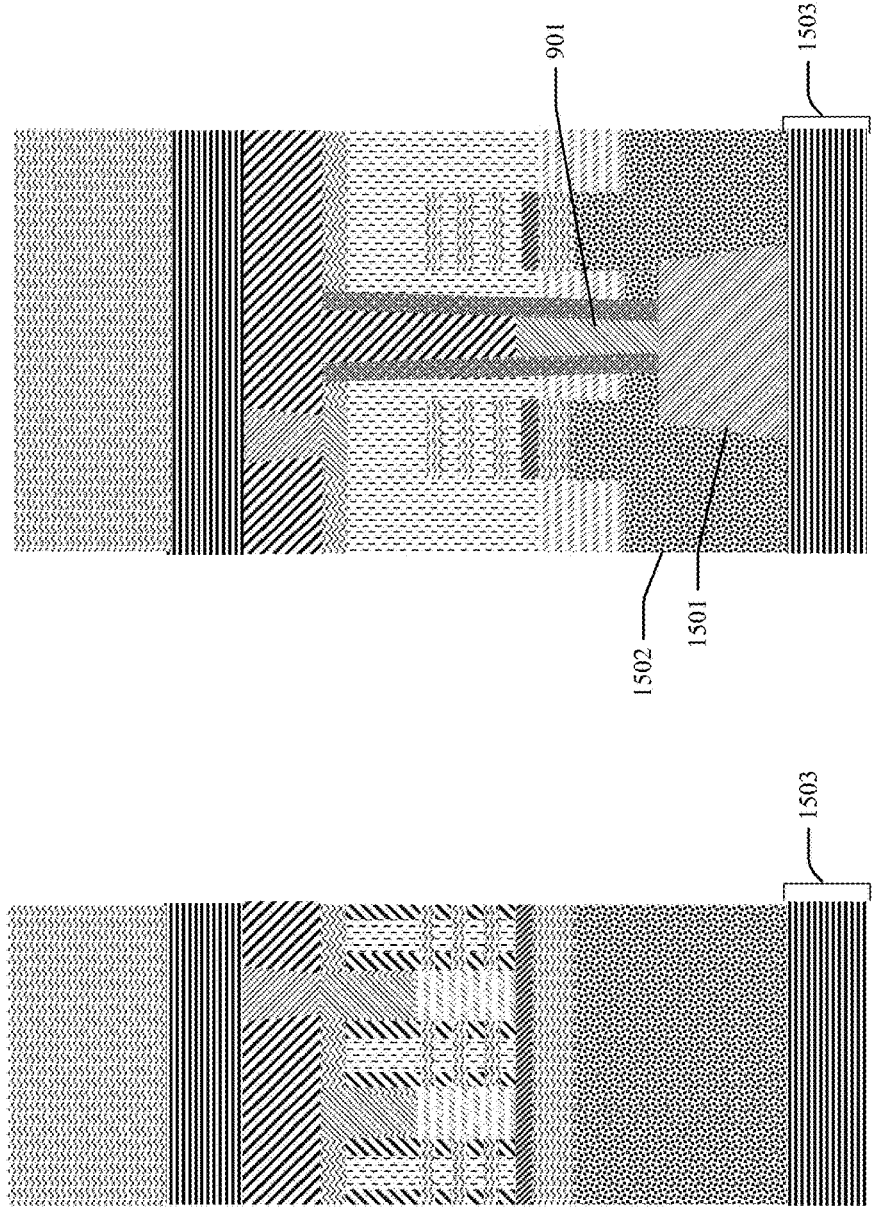

FIGS. 15A, 15B. 15C and 15D illustrate various cross-sections of a thirteenth stage of production of a semiconductor device in accordance with one or more embodiments described herein. FIGS. 15A, 15B. 15C and 15D illustrates cross-sections along lines 1220, 1230, 1240 and 1250 respectively of FIG. 12A. As shown, a backside power rail 1501 can be formed and connected to the bottom of power via bar 901. Backside ILD 1502 can be deposited around backside power rail 1501 and a backside power delivery network 1503 can be formed and connected to backside power rail 1501. Accordingly, power can be supplied to the semiconductor device from backside power delivery network 1503, to backside power rail 1501, and through power via bar 901.

Figure 16:
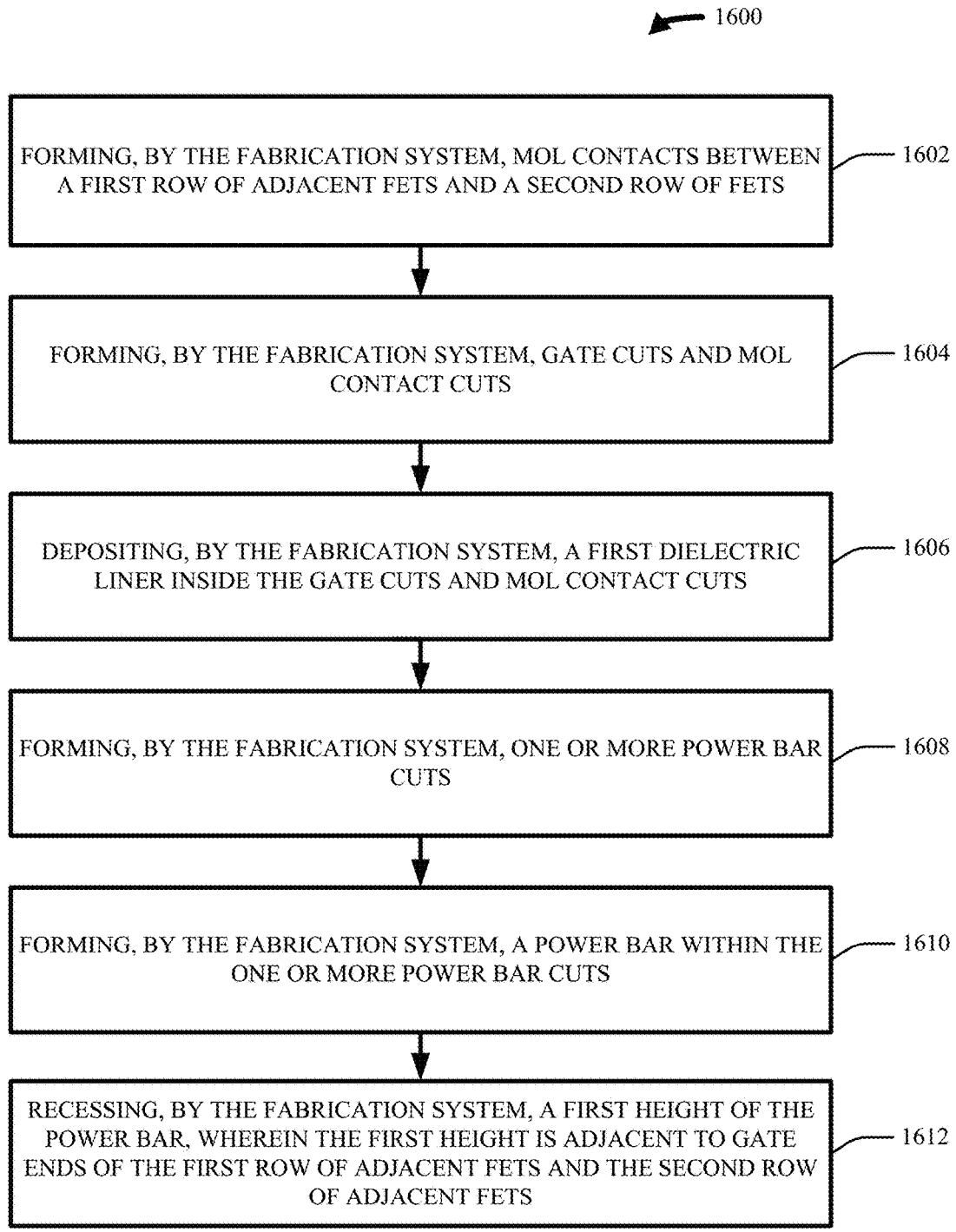
FIG. 16 illustrates a flow diagram of an example, non-limiting method of fabrication, by a fabrication system, of a semiconductor device in accordance with one or more embodiments described herein.

FIG. 16 illustrates a flow diagram of an example, non-limiting method of fabrication 1600, by a fabrication system, of a semiconductor device in accordance with one or more embodiments described herein.

At 1602, method 1600 can comprise forming, by the fabrication system, middle of line (MOL) contacts between a first row of adjacent FETs and a second row of adjacent FETs of a substrate.

At 1604, method 1600 can comprise forming, by the fabrication system, gate cuts and MOL contact cuts across the substrate. For example, the gate cuts and MOL contact cuts can be placed across the MOL contacts between the first row of FETs and the second row of FETs.

At 1606, method 1600 can comprise depositing, by the fabrication system, a first dielectric liner inside the gate cuts. In an embodiment, the dielectric liner can comprise at least one of SiN, SiCO, SiOCN, or another suitable dielectric material.

At 1608, method 1600 can comprise forming, by the fabrication system, one or more power via bar cuts and dielectric liner cuts.

At 1610, method 1600 can comprise forming, by the fabrication system, a power via bar within gate cut region that are not power via bar cuts (which is filled with dielectric 701).

At 1612, method 1612 can comprise recessing, by the fabrication system, a first height of the power via bar, wherein the first height is adjacent to gate ends of the first row of adjacent FETs and the second row of adjacent FETs.

Figure 17:
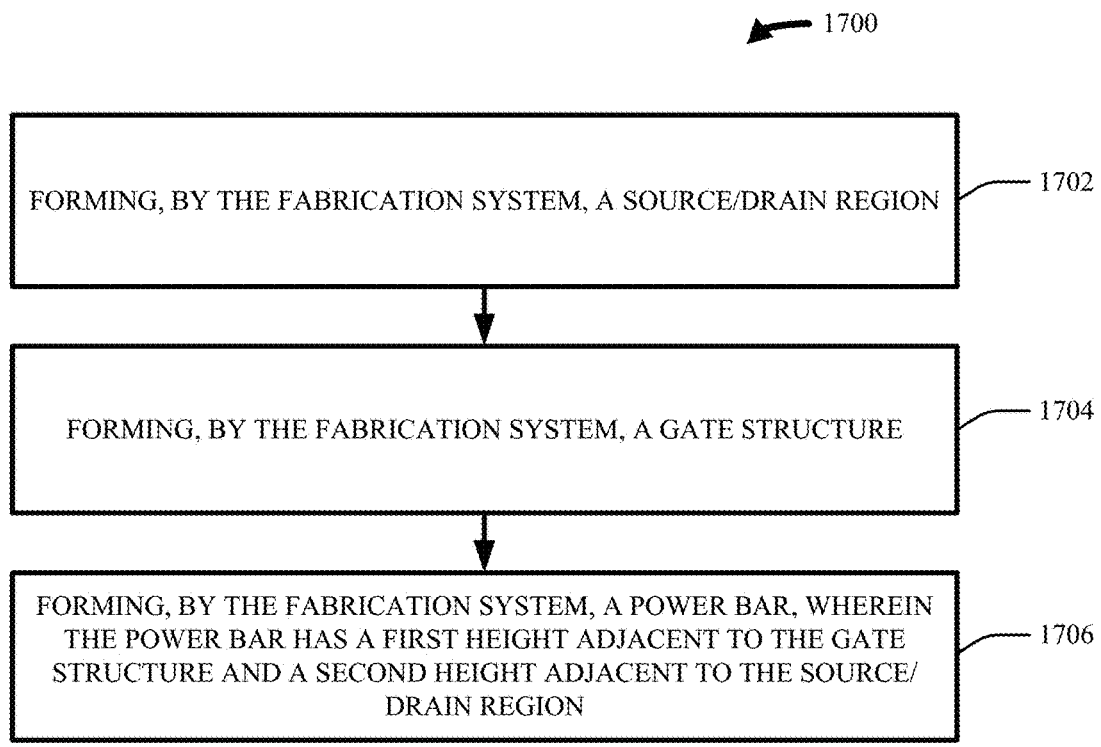
FIG. 17 illustrates a flow diagram of an example, non-limiting method of fabrication, by a fabrication system, of a semiconductor device in accordance with one or more embodiments described herein.

FIG. 17 illustrates a flow diagram of an example, non-limiting method of fabrication 1700, by a fabrication system, of a semiconductor device in accordance with one or more embodiments described herein.

At 1702, method 1700 can comprise, forming, by the fabrication system, a source/drain region.

At 1704, method 1700 can comprise forming, by the fabrication system, a gate structure. For example, the gate structure can comprise gate ends connected to FETs and a channel between the gate ends.

At 1706, method 1700 can comprise forming, by the fabrication system, a power via bar, wherein the power via bar has a first height adjacent to the gate structure and a second height adjacent to the source/drain region. For example, a metallization process can be utilized to deposit a power via bar in the channel between the gate ends. The portions of the power via bar adjacent to the gate ends can then be recessed to form the first height.

An advantage of such methods, devices and/or systems is that they enable semiconductor devices with increased performance. For example, by recessing a power via bar between gate ends of a gate structure, parasitic capacitance across the gate structure is reduced, thereby improving device performance. A practical application of the above-described devices is that they offer decreased parasitic capacitance, and thus improved performance when compared to other designs.

What is claimed is:

1. A semiconductor device comprising:
   a first row of adjacent field-effect transistors (FETs);
   a second row of adjacent FETs; and
   a power via bar coupled to a backside power rail and recessed between respective gate ends of the first row of adjacent FETs and the second row of adjacent FETs.

2. The semiconductor device of claim 1, further comprising a second FET, wherein the power via bar is located between the FET and the second FET.

3. The semiconductor device of claim 2, wherein the second FET comprises an n-channel FET (NFET).

4. The semiconductor device of claim 1, wherein the power via bar has greater height adjacent to a source and drain region of the second FET relative to a gate of the second FET.

5. The semiconductor device of claim 1, wherein the FET comprises an n-channel FET (NFET).

6. A method for fabricating a semiconductor device the method comprising:
   forming a first row of adjacent field-effect transistors (FETs);
   forming a second row of adjacent field-effect transistors (FETs);
   patterning a power via bar between the first row of adjacent FETs and the second row of adjacent FETs, wherein the power via bar is connected to one or more source/drain regions; and
   recessing the power via bar between respective gate ends of the first row of adjacent FETs and the second row of adjacent FETs.

7. The method of claim 6, further comprising connecting, the power via bar to a power delivery network on a backside of the first row of adjacent FETs and the second row of adjacent FETs.

8. The method of claim 6, further comprising, depositing a dielectric fill material between the gate ends of the first row of adjacent FETs and the second row of adjacent FETs over the power via bar.

9. The method of claim 6, wherein the first row of adjacent FETs comprise one or more n-channel FETs (NFETs).

10. The method of claim 6, wherein the second row of adjacent FETs comprise one or more n-channel FETs (NFETs).

11. Method for fabricating a semiconductor device, the method comprising:
    forming middle of line (MOL) contacts between a first row of adjacent field effect transistors (FETs) and a second row of FETs;
    forming gate cuts and MOL contact cuts;

forming a first dielectric liner inside the gate cuts;
forming and one or more dielectric liner cuts;
forming a power via bar within the gate cuts; and
recessing a first height of the power via bar, wherein the first height is adjacent to gate ends of the first row of adjacent FETs and the second row of adjacent FETs.

12. The method of claim 11, further comprising connecting the power via bar to a power delivery network on a backside of the first row of adjacent FETs and the second row of adjacent FETs.

13. The method of claim 11, wherein the power via bar comprises a second height adjacent to one or more source/drain regions.

14. The method of claim 13, wherein the second height is greater than the first height.

15. The method of claim 11, wherein the first row of adjacent FETs comprise one or more n-channel FETs (NFETs).

16. A semiconductor device comprising:
a source/drain region;
a gate structure; and
a power via bar having a first height adjacent to the gate structure and a second height adjacent to the source/drain region, wherein the gate structure comprises a first gate coupled to a first row of adjacent field-effect transistors (FETs) and a second gate coupled to a second row of adjacent FETs, and wherein the first height of the power via bar is recessed between the first gate coupled to the first row of adjacent FETs and the second gate coupled to the second row of adjacent FETs.

17. The semiconductor device of claim 16, wherein the second height is greater than the first height.

18. The semiconductor device of claim 16, wherein the power via bar is further connected to a power delivery network on a backside of the first row of adjacent FETs and the second row of adjacent FETs.

19. The semiconductor device of claim 16, wherein the first row of adjacent FETs comprise one or more NFETs.

20. The semiconductor device of claim 16, wherein the second row of adjacent FETs comprise one or more n-channel FETs (NFETs).

21. A method for fabricating a semiconductor device by a fabrication system, the method comprising:
forming a source/drain region;
forming a gate structure; and
forming a power via bar having a first height adjacent to the gate structure and a second height adjacent to the source/drain region, wherein the first height and the second height are distinct.

22. The method of claim 21, wherein the second height is greater than the first height.

23. The method of claim 21, wherein the forming the gate structure comprises forming a first gate coupled to a first row of adjacent FETs and forming a second gate coupled to a second row of adjacent FETs.

24. The method of claim 21, further comprising forming a backside power delivery network coupled to the power via bar.

* * * * *